(12) United States Patent
Meiser et al.

(10) Patent No.: US 8,519,473 B2
(45) Date of Patent: Aug. 27, 2013

(54) VERTICAL TRANSISTOR COMPONENT

(75) Inventors: Andreas Peter Meiser, Unterhaching (DE); Markus Zundel, Egmatting (DE); Christoph Kadow, Gauting (DE)

(73) Assignee: Infineon Technologies AG, Neubiberg (DE)

(*) Notice: Subject to any disclaimer, the term of this patent is extended or adjusted under 35 U.S.C. 154(b) by 60 days.

(21) Appl. No.: 12/836,422

(22) Filed: Jul. 14, 2010

(65) Prior Publication Data

US 2012/0012924 A1   Jan. 19, 2012

(51) Int. Cl.
*H01L 29/78* (2006.01)
(52) U.S. Cl.
USPC ........... 257/329; 257/330; 257/331; 257/332; 257/333; 257/334; 257/E29.131
(58) Field of Classification Search
USPC ................. 257/329, 330, 331, 332, 333, 334, 257/E29.131
See application file for complete search history.

(56) References Cited

U.S. PATENT DOCUMENTS

| | | | |
|---|---|---|---|
| 5,945,708 | A | 8/1999 | Tihanyi |
| 6,284,604 | B1 | 9/2001 | Tihanyi |
| 7,723,782 | B2 | 5/2010 | Hirler |
| 8,138,036 | B2 | 3/2012 | Andry et al. |
| 2009/0166720 | A1 | 7/2009 | Zundel |
| 2011/0266683 | A1 | 11/2011 | Feng |
| 2011/0291245 | A1* | 12/2011 | Feng et al. ............. 257/621 |
| 2012/0025302 | A1* | 2/2012 | Nakao .................... 257/330 |
| 2012/0032259 | A1* | 2/2012 | Ho et al. ................. 257/330 |

FOREIGN PATENT DOCUMENTS

| | | |
|---|---|---|
| DE | 19638438 A1 | 9/1996 |
| DE | 102005041285 A1 | 3/2007 |
| DE | 102006046869 A1 | 4/2008 |

* cited by examiner

*Primary Examiner* — Ngan Ngo
(74) *Attorney, Agent, or Firm* — Murphy, Bilak & Homiller, PLLC

(57) ABSTRACT

A vertical transistor component is produced by providing a semiconductor body with a first surface and a second surface, producing at least one gate contact electrode in a trench, the trench extending from the first surface through the semiconductor body to the second surface, and producing at least one gate electrode connected to the at least one gate contact electrode in the region of the first surface.

9 Claims, 33 Drawing Sheets

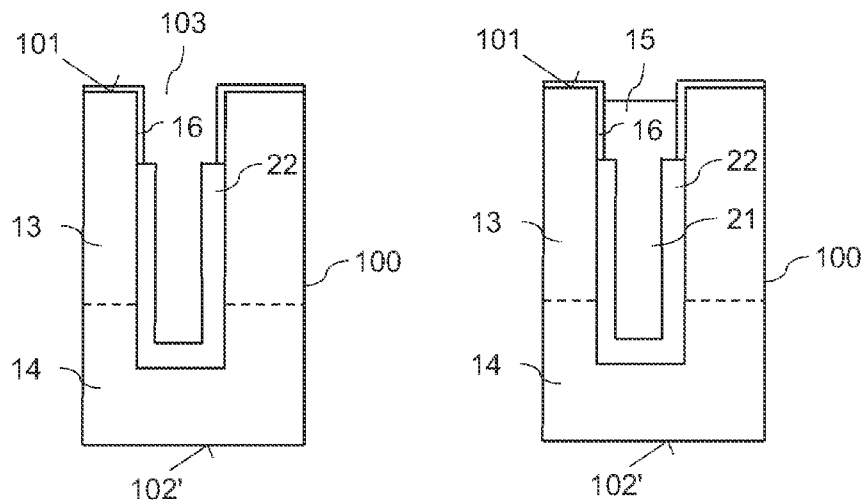
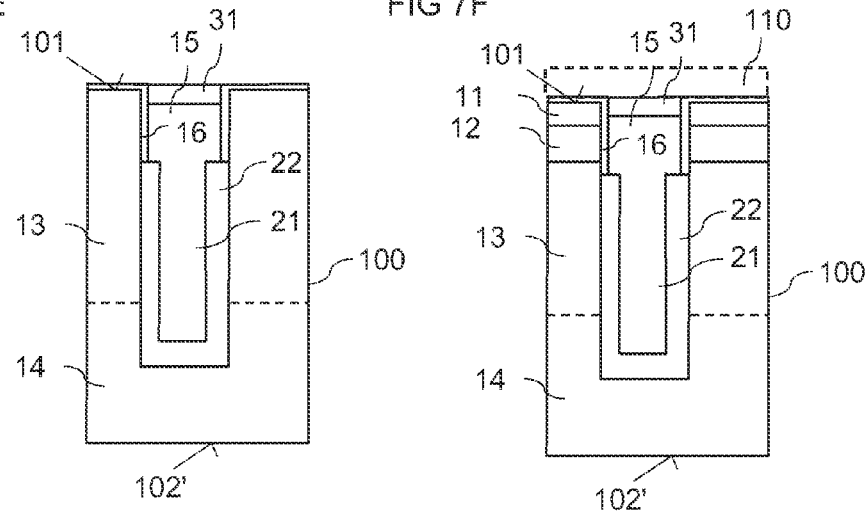

VERTICAL TRANSISTOR COMPONENT

TECHNICAL FIELD

The present invention relates to a vertical transistor component, in particular a vertical power transistor component, and to a method for producing a vertical transistor component.

BACKGROUND

A vertical transistor component, like a vertical MOSFET or a vertical IGBT, includes a semiconductor body with a first and a second surface in which at least one source region, at least one body region, a drift region, and a drain region are integrated, wherein in an IGBT the source and drain regions are also referred to as emitter regions, and the body and drift regions are also referred to as base regions. Usually, the source region and the body region are integrated in the region of the first surface, while the drain region is integrated in the region of the second surface and separated from the body region by the drift region. At least one gate electrode, which serves to switch the component on and off, is arranged above the first surface or is integrated in a trench of the semiconductor body in the region of the first surface. The source region is electrically contacted by a source electrode which is usually arranged above the first surface and which is electrically insulated from a gate terminal (gate pad), with the latter contacting the gate electrode. The drain region is electrically contacted by a drain electrode which is usually arranged above the second surface.

Vertical transistor components of this kind can be mounted on a carrier with their second surface facing towards the carrier. In such an arrangement the carrier can serve as a drain terminal of the transistor component and can further serve as a cooling element for dissipating heat generated in the semiconductor body. When the vertical transistor element is operated as a switch, heat is mainly generated in its active regions, like body and drift regions. Since these active regions are arranged close to the first surface while the cooling element is arranged on the second surface, there is a relatively high thermal resistance resulting from those regions of the semiconductor body which are arranged between the pn-junction and the second surface. The thermal resistance could be reduced by arranging a cooling element on the first surface. However, such cooling element would short-circuit the gate and the source electrode which are both arranged at the first surface.

There is, therefore, a need for a vertical transistor component which has better properties in terms of dissipating heat from the semiconductor component.

SUMMARY

According to an embodiment of a vertical transistor component, the component includes a semiconductor body with a first surface and a second surface, a drift region, and at least one source region and at least one body region arranged between the drift region and the first surface, with the body region being arranged between the source region and the drift region. At least one gate electrode is arranged adjacent to the body zone, and a gate dielectric is arranged between the gate electrode and the at least one body region. A drain region is arranged between the drift region and the second surface. A source electrode electrically contacts the at least one source region, is electrically insulated from the gate electrode and is arranged above the first surface, and a drain electrode electrically contacts the drain region and is arranged above the second surface. The component further includes at least gate contact electrode which is electrically insulated from the semiconductor body, extends through the semiconductor body from the first surface to the second surface, and is electrically connected with the at least one gate electrode.

According to an embodiment of method of producing a vertical transistor component, the method includes providing a semiconductor body with a first surface and a second surface; producing at least one gate contact electrode in a trench, the trench extending from the first surface through the semiconductor body to the second surface; and producing at least one gate electrode connected to the at least one gate contact electrode in the region of the first surface.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like signals and circuit components.

FIG. 7 which includes FIGS. 7A to 7H illustrates method steps for forming a gate electrode and a gate connection electrode of a vertical transistor component in a common trench.

FIG. 14 which includes

FIG. 17 which includes

FIG. 18 which includes

FIG. 19 which includes

DETAILED DESCRIPTION

Figure 1:
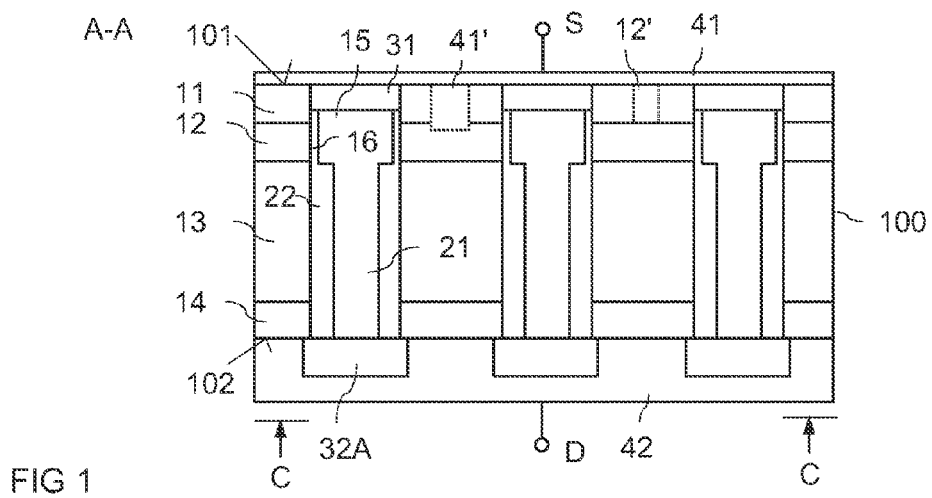
FIG. 1 illustrates a vertical cross section in a first section plane through a vertical transistor component according to a first embodiment.
Figure 2:
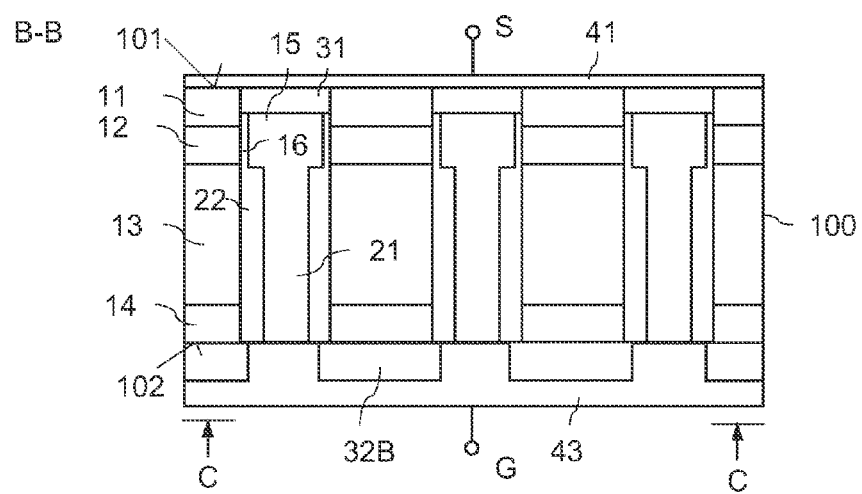
FIG. 2 illustrates a vertical cross section in a second section plane through the transistor component of FIG. 1.

FIGS. 1 and 2 illustrate schematic vertical cross sections through a vertical transistor component according to a first embodiment. The transistor component includes a semiconductor body 100 with a first surface 101 and with a second surface 102 which is opposite to the first surface 101. FIG. 1 illustrates a vertical cross section through the semiconductor body 100 in a first section plane A-A, and FIG. 2 illustrates a cross section in a second section plane B-B. These section planes A-A. B-B extends perpendicular to the first and second surfaces 101, 102. In FIG. 1 as well as in the other figures which will be explained in detail further below only sections of the respective vertical transistor components are illustrated.

The semiconductor body 100 can comprise any suitable and commonly known semiconductor material, such as silicon (Si), silicon carbide (SiC), gallium arsenide (GaAs), or gallium nitride (GaN). The semiconductor body 100 includes a drift region 13 of a first conductivity type, and a source region 11 and a body region 12 arranged between the drift region 13 and the first surface 101. The source region 11 is of the first conductivity type, and the body region 12 is of the second conductivity type and is arranged between the source region 11 and the drift region 13. A drain region 14 is arranged between the drift region 13 and the second surface 102. The source and drain regions 11, 12 are more highly doped than the drift region 13 and the drain region 14 is more highly doped than the drift region 13. The doping concentration of the drift region 13 is, for example, in the range of between $10^{15}$ (E15) cm$^{-3}$ and $10^{17}$ (E17) cm$^{-3}$, the doping concentration of the body region 12 is, for example, in the range of between $10^{16}$ (E16) cm$^{-3}$ and $10^{18}$ (E18) cm$^{-3}$, the doping concentration of the source region 11 is, for example, in the range of between $10^{19}$ (E19) cm$^{-3}$ and $10^{21}$ (E21) cm$^{-3}$, and the doping concentration of the drain region 14, is, for example, in the range of between $10^{19}$ (E19) cm$^{-3}$ and $10^{21}$ (E21) cm$^{-3}$.

The transistor component can be implemented as a MOSFET or as an IGBT. In a MOSFET the drain region 14 is of the same conductivity type as the drift region 13, but more highly doped. In an IGBT the drain region 14 (which is also referred to as collector region in an IGBT) is doped complementarily to the drift region 13. Further, the component can be implemented as an n-channel component or as a p-channel component. In an n-channel component the drift region 13 and the source region 11 are n-doped, while the body region 12 is p-doped. In a p-channel component the drift region 13 and the source region 11 are p-doped while the body region 12 is n-doped.

Optionally, a field stop region (not shown) that is more highly doped then the drift region 13 can be arranged in the drift region 13 closer to than drain region 14 than to the body region 12, or between the drift region 13 and the drain region 14.

The explanations provided hereinabove concerning the doping concentration of the drift region 13, the source region 11, the body region 12 and the drain region 14 and the explanations concerning the conductivity type of these semiconductor regions apply to the other transistor components that will be explained hereinbelow accordingly. The reference characters of these semiconductor regions used in FIGS. 1 and 2 will be used throughout the drawings.

Referring to FIGS. 1 and 2, the transistor component further includes at least one gate electrode 15. The gate electrode 15 is implemented as a trench electrode which is arranged in a trench that extends from the first surface 101 into the semiconductor body 100. The gate electrode 15 is arranged adjacent to the body region 12 and in the vertical direction of the semiconductor body 100 extends from the source region 11 through the body region 12 into the drift region 13. The gate electrode 15 is dielectrically insulated from the body region 12 and the source 11 and drift 13 regions by a gate dielectric 16. The gate electrode 15 can comprise any suitable gate electrode material, like a doped polycrystalline semiconductor material, such as polysilicon, or a metal. The gate dielectric 16 can comprise any suitable gate dielectric material, like an oxide, such as silicon oxide ($SiO_2$), a nitride, or a high-k dielectric. These explanations concerning the gate electrode 15 and the gate dielectric 16 apply to the other embodiments that will be explained hereinbelow accordingly. The reference characters 15, 16 are used for the gate electrode and the gate dielectric throughout the drawings.

The component further includes a source electrode 41 that electrically contacts the source region 11. The source electrode 41 is arranged above the first surface 101 and is electrically insulated from the gate electrode 15 by a gate insulation layer 31. Optionally, the source electrode 41 also contacts the body zone 12, which also applies to the transistor components illustrated further below. In order to contact the body zone 12 the source electrode 41 may include a contact plug which extends through the source region 11 into the body region 12. An example of such contact plug 41' extending through the source region 11 down to the body region is illustrated in dotted lines in the left part of FIG. 1. Alternatively, sections of the body region 12 may extend to the first surface 101. An example of a body region section 12' which extends to the first surface 101 is shown in dotted lines in the right section of FIG. 1. It should be noted that in each of the transistor components illustrated below, the source electrode 41 can be connected to the body region 12. However, contacts between the source electrode 41 and the body region are not explicitly illustrated in the other figures. The source electrode 41 forms a source terminal S of the transistor component, or is connected to a source terminal.

A gate connection electrode 21 which is electrically connected to the gate electrode 15 extends through the drift region 13 and the drain region 14 to the second surface 102 and is dielectrically insulated from these semiconductor regions 13, 14 by a dielectric layer 22. This dielectric layer 22 can be made of the same material like the gate dielectric 16, but can also be made of a different dielectric material. According to one embodiment the dielectric layer 22 of the gate connection electrode 21 is thicker than the gate dielectric 16, i.e. a distance between the gate connection electrode 21 and its surrounding semiconductor region is larger than the distance between the gate electrode 15 and the body region 12.

A drain electrode 42 which electrically contacts the drain region 14 and which forms a drain terminal D of the component, and a gate contact electrode 43 which is electrically connected with the gate electrode 15 and which forms a gate terminal G of the transistor component are arranged on the second surface 102 of the transistor component. The gate electrode 15 is electrically connected to the gate contact electrode 43 via a gate connection electrode 21. The gate connection electrode 21 is arranged below the gate electrode 15 and extends from the gate electrode 15 to the second surface 102 of the semiconductor body.

FIGS. 1 and 2 show the semiconductor component in two different vertical cross sections, a first vertical cross section A-A (see FIG. 1) and a second vertical cross section B-B (see FIG. 2). The drain electrode 42 and the gate contact electrode 43 are arranged distant to one another on the second surface 102. In those sections of the second surface 102 in which the drain electrode 42 is present, the gate connection electrode 21 is electrically insulated from the drain electrode 42 by first insulation layer 32A, and in those sections of the second surface 102 in which the gate contact electrode 43 is present, the drain region 14 is insulated from the gate contact electrode 43 by second insulation layer 32B.

Figure 3:
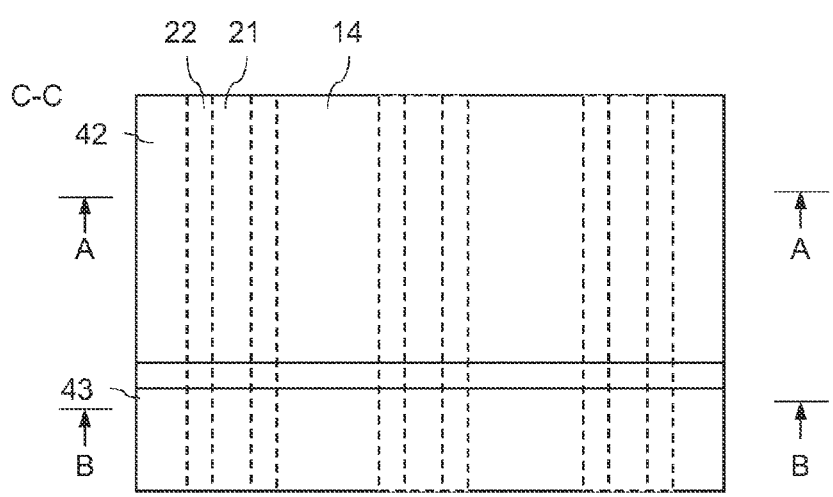
FIG. 3 illustrates a horizontal cross section through the transistor component of FIGS. 1 and 2.

FIG. 3 shows a top view on the drain electrode 42 and the gate contact electrode 43. As can be seen from FIG. 3, the gate contact electrode 43 and the drain electrode 42 can be arranged distant to one another in a horizontal direction of the semiconductor body. In the embodiment illustrated in FIGS. 1 to 3 this direction is a direction perpendicular to the vertical section planes A-A and B-B illustrated in FIGS. 1 and 2. For a better understanding, the gate connection electrode 21 and its insulation layer 22 are also illustrated (in dashed lines) in FIG. 3.

Referring to FIGS. 1 to 3, the transistor component can have a cellular structure. In this case there is a plurality of identical transistor cells, with each transistor cell including a body region 12, a source region 13 and a section of the gate electrode 15 adjacent to the body region 12. The individual transistor cells are connected in parallel by virtue of the fact that the source regions 11 (and optionally the body regions 12) are jointly connected to the source electrode 41. In the embodiment illustrated in FIGS. 1 to 3 the gate connection electrode 21 and its insulation layer 22 separate the drift region 13 and the drain region 14 into a plurality of sections, with each of these sections belonging to one of the transistor cells. These drift region 13 and drain region 14 sections are jointly connected to the drain electrode 42.

Referring to FIG. 3 the gate electrode 15 and, therefore, the gate connection electrode 21 arranged below the gate electrode 15 can have a strip-like geometry. In this case the gate electrode 15 includes a plurality of strip-like gate electrode sections that are arranged in parallel with one another. The body and source regions 11, 12 are arranged between two of these gate electrode section. It goes without saying, that the gate electrode 15 may have any other known gate electrode geometry as well such as, for example, a grid-like geometry. In this case, the gate electrode 15 in the horizontal plane has the geometry of a grid, like a rectangular, square, or hexagonal grid.

The vertical transistor component of FIGS. 1 to 3 can be controlled like a commonly known vertical transistor by applying a suitable drive potential to the gate electrode 15, wherein in the component of FIGS. 1 to 3 the drive potential is applied to the gate electrode 15 via the gate contact electrode 43 and the gate connection electrode 21. The component is switched on when this drive potential is such that a conducting channel is generated in the body region 12 between the source region 11 and the drift region 13, and the component is switched off when such conducting channel is interrupted. The component can be mounted to a carrier with the source electrode 41, i.e. such that the first surface 101 faces the carrier. This carrier can serve as a source terminal of the component, and can further serve as a heat sink for dissipating heat from the semiconductor component. When the transistor component is operated as a switch the heat is mainly generated in the region of the pn-junction between the source region 11 and the body region 12. Since the pn-junction is arranged closer to the first surface 101 than to the second surface 102 mounting a heat sink to the first surface 101 results in a lower thermal resistance for the heat to be dissipated.

In the transistor component according to FIGS. 1 to 3 the gate connection electrode 21 is an extension of the gate electrode 15 and extends from the gate electrode 15 to the second surface 102. Due to this there is a relatively high gate-drain capacitance which is formed by the gate connection electrode 21, the dielectric layer 22 of the gate connection electrode 21 and the drift region 13 and the drain region 14.

Figure 4:
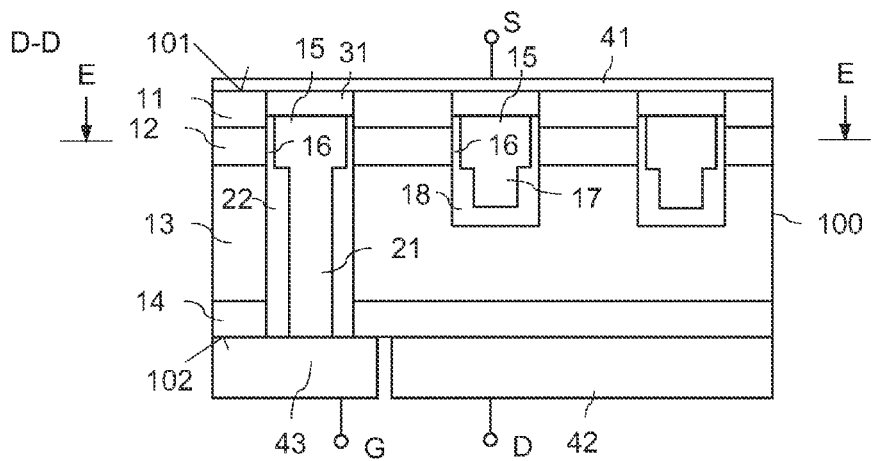
FIG. 4 illustrates a vertical cross section through a vertical transistor component according to a second embodiment.

FIG. 4 illustrates a cross section through a vertical transistor component which—compared with the component according to FIGS. 1 to 3—has a reduced gate-drain capacitance. In this component the gate connection electrode 21 is not arranged everywhere below the gate electrode 15, but is arranged only below sections of the gate electrode. In this component there are two different types of trenches: gate trenches, and gate and connection trenches. A gate trench is a trench in which only the gate electrode 15 or a section of the gate electrode 15 is arranged, and in which optionally a first field electrode 17 is arranged. In the embodiment illustrated in FIG. 4 such a first field electrode 17 is shown. The first field electrode 17 in this embodiment is integrally formed with the gate electrode 15 and is dielectrically insulated from the drift region 13 by a field electrode dielectric 18. The field electrode dielectric 18 can include any suitable dielectric material, in particular a dielectric material used for the gate dielectric 16. The field plate dielectric 18 is, however, usually thicker than the gate dielectric 16. In the embodiment according to FIG. 4 the field electrode 17 is electrically connected with the gate electrode 15, i.e. has gate potential. However, this is only an example. According to a further embodiment (not illustrated) the field electrode 17 is electrically insulated from the gate electrode 15 and is electrically connected to the source electrode 41.

The gate and connection trench is a trench that includes the gate electrode 15 or a section of the gate electrode and the gate connection electrode 21 or a section of the gate connection electrode 21, with the gate connection electrode 21 being arranged below the gate electrode 15 between the gate electrode 15 and the second surface 102. The gate and connection trench corresponds to the trenches explained hereinabove with reference to FIGS. 1 to 3.

In FIG. 4 one gate and connection trench and two gate trenches are illustrated. The gate electrode section 15 arranged in the gate trenches are electrically connected with the gate electrode section 15 in the gate and connection trench, so that the gate electrode 15 section in each trench is connected to the gate contact electrode 43 via the gate connection electrode 21.

Figure 5:
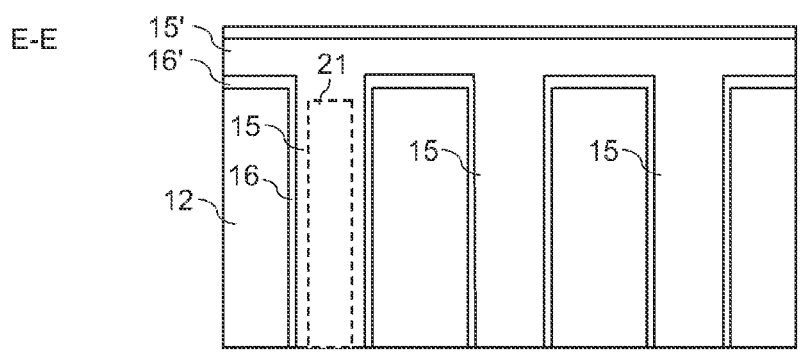
FIG. 5 illustrates a horizontal cross section through the transistor component of FIG. 4.

FIG. 5 illustrates a horizontal cross section in a section plane E-E through the transistor component of FIG. 4 in order to illustrate one embodiment of electrically connecting the gate electrode 15 sections in the individual trenches with one another. In this embodiment the trenches, i.e. the gate trenches and the gate and connection trench have a strip-like geometry. In FIG. 5 the gate connection electrode 21 is illustrated in dashed lines in the gate and connection trench. Referring to FIG. 5, a further connection trench extends perpendicular to the trenches and has a further connection electrode 15' that is electrically connected to the gate electrode section 15 in each of the trenches. The further connection electrode 15' therefore electrically connects the gate electrode sections 15 in the individual trenches with one another. The further connection electrode is dielectrically insulated from the semiconductor body by a further dielectric layer 16'.

Instead of providing a connection trench with a further connection electrode 15', the gate electrode could also be realized with a grid-like geometry which has gate electrode sections that are electrically connected with one another. In this case no additional connection electrode 15' is required.

It should be mentioned that the explanations provided hereinabove with reference to FIGS. 1 to 4 concerning the gate electrode 15, the first field electrode 17 and the dielectric layers 16, 18, 22 apply accordingly to the transistor components explained hereinbelow.

Figure 6A:
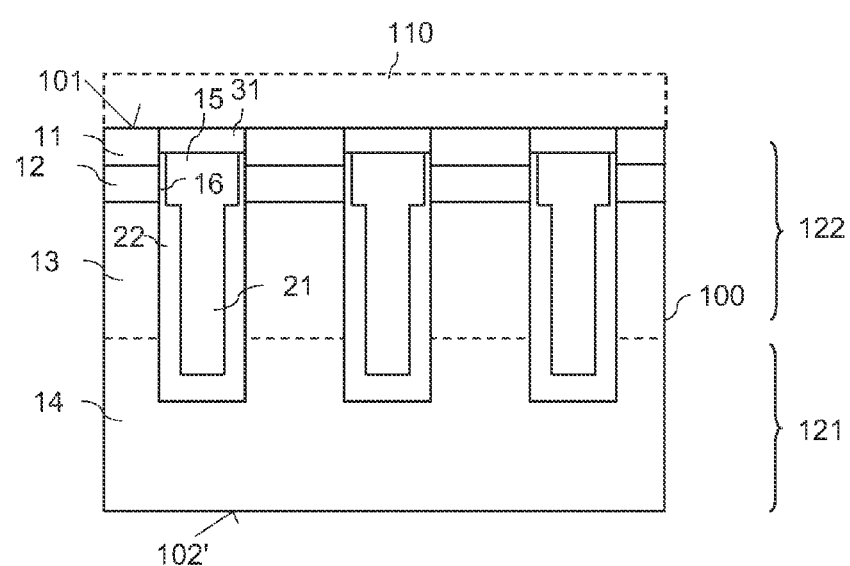
FIG. 6 which includes FIGS. 6A to 6E schematically illustrates method steps for forming the transistor component of FIG. 1.

An embodiment of a method for producing the transistor component of FIGS. 1 to 3 will now be explained with reference to FIGS. 6A to 6E. These figures illustrate vertical cross sections through the semiconductor body during different method steps. Referring to FIG. 6A, the method includes providing the semiconductor body 100 with the first surface 101 and a second surface 102'. This second surface 102' is not yet the second surface 102 (see FIGS. 1, 2 and 4) of the completed transistor component. The semiconductor body 100 of FIG. 6A includes the gate and connection trenches, wherein each of these trenches includes a section of the gate electrode 15 and a section of the gate connection electrode 21. However, these gate and connection trenches do not yet extend to the second surface 102' at this stage of the production method. FIG. 6A illustrates the transistor component after producing the source and body regions 11, 12. These source and body regions 11, 12 are, for example, produced by implanting and/or diffusing dopants of the first and second conductivity type via the first surface 101 into the semiconductor body.

According to a first embodiment the semiconductor body 100 includes two semiconductor layers: A first semiconductor layer 121 which has the conductivity type of the drain region 14 and in the completed, i.e. finally processed, component forms the drain region 14; and a second layer 122 which has the conductivity type of the drift region 13. In this second layer 122 the source and body regions are formed by implanting and/or diffusing dopants into the second layer 122, wherein those regions of the second layer 122 in which the basic doping of the second layer 122 remains after forming the source 11 and body 12 regions form the drift region 13. The first semiconductor layer 121 is, for example, a semiconductor substrate, while the second layer 122 is, for example, an epitaxial layer.

According to a second embodiment the semiconductor body 100 is a semiconductor substrate that has the conductivity type of the drift region 13 and a basic doping which corresponds to the doping concentration of the drift region 13. In this substrate the source and body regions 11, 12 are produced by dopant implantation and/or diffusion methods. The same applies to the drain region 14 which, in this case, is produced at a later stage.

These method steps for producing the source and body regions 11, 12, the drift region 13 and the drain region can also be used for producing these semiconductor regions in each of the transistor components explained hereinbelow.

Optionally a carrier 110 is temporarily attached to the first surface 101. The carrier 110 serves to stabilize the semiconductor body 100 during further method steps. The carrier 110 includes, for example, a glass layer or a semiconductor layer.

Figure 6B:
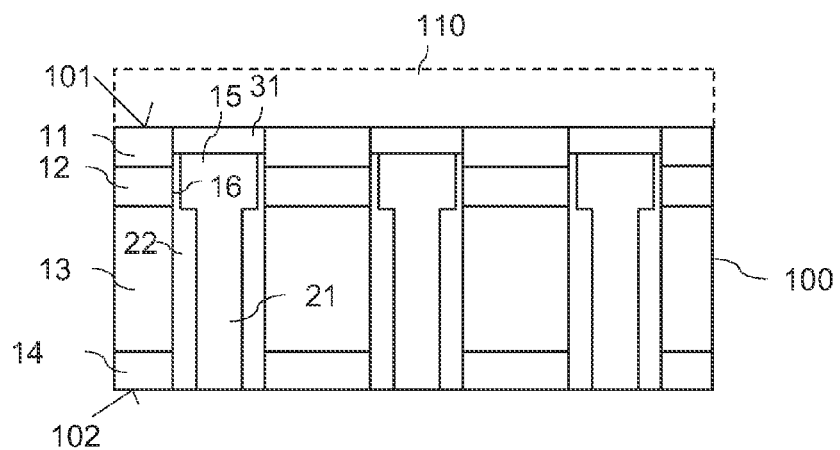

Referring to FIG. 6B, the semiconductor body 100 is partly removed at the second surface 102' in order to reveal the gate connection electrode 21. Dependent on the particular geometry of the gate connection electrode 21, the gate connection electrode 21 separates the drift region 14 into different drift region sections which are electrically insulated from one another in the semiconductor body 100 by the gate connection electrode 21 and the dielectric layer 22 insulating the gate connection electrode 21 from the semiconductor body 100. Removing the semiconductor body 100 at the second surface 102' can include any kind of suitable removing process, like an etching process, a mechanical polishing process, a chemical polishing process or a chemical-mechanical polishing (CMP) process. This removal process results in the final second surface 102 of the semiconductor body 100. In case the semiconductor body 100 includes the first and the second semiconductor layers 121, 122 those parts of the first semiconductor layer 121 that remain after the removal process form the drain region 14 of the transistor component. In case the semiconductor body 100 only includes a semiconductor substrate that has a basic doping corresponding to the doping of the drift region 13, the drain region 14 is produced by implanting and/or diffusing dopants into the semiconductor body 100 via the second surface 102.

Figure 6C:
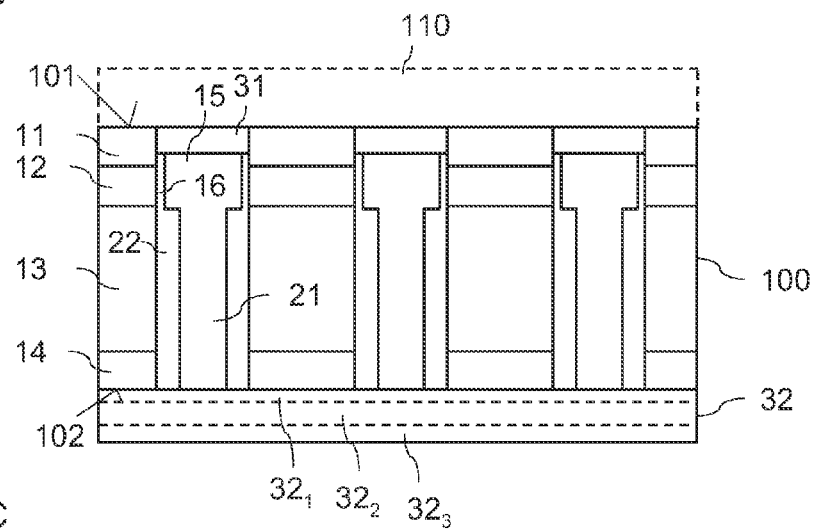

Referring to FIG. 6C an insulation layer 32 is formed on the second surface 102. Parts of this insulation layer 32 in the completed component form the first and second insulation layer 32A, 32B which electrically insulate the gate connection electrode 21 from the drain electrode 42 and the drain region 14 from the gate contact electrode 43. The insulation layer 32 can, for example, be a composite layer with different sub-layers, like a first sub-layer $32_1$ of an oxide, a second sub-layer $32_2$ of an undoped silicon glass (USG) and a third sub-layer $32_3$ of PSG (phosphor silicate).

Figure 6D:
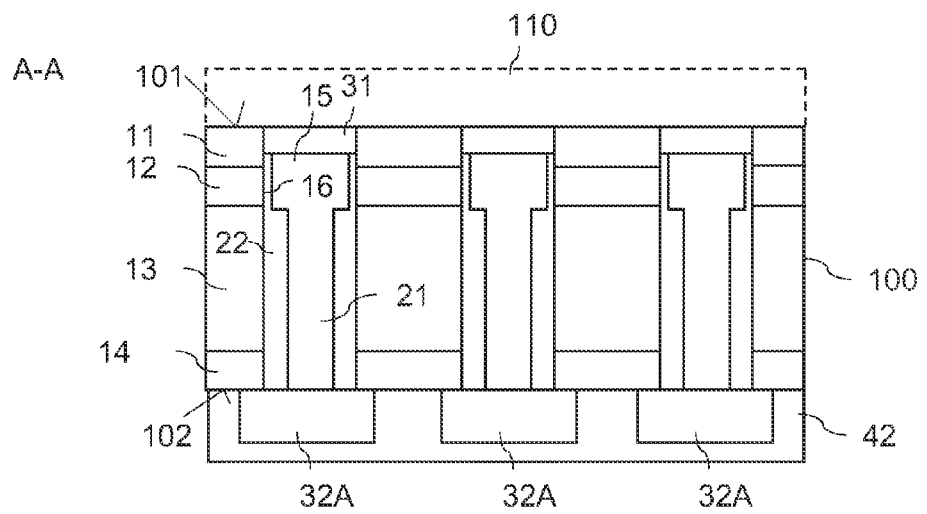
Figure 6E:
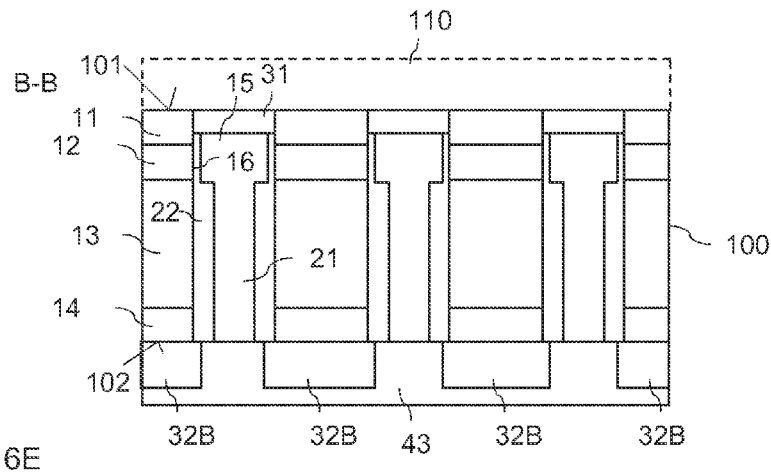

Referring to FIGS. 6D and 6E that show vertical cross sections through the semiconductor body 100 in the first and second section planes A-A, B-B the insulation layer 32 is than patterned in order to the form first insulation layer 32A on sections of the gate connection electrode 21 and in order to form second insulation layers 32B on sections of the drift region 15. The insulation layer 32 can be patterned using an etching process in connection with an etch mask (not shown).

The transistor component is completed by producing the drain electrodes 42 in those sections of the second surface 102 in which the gate connection electrode 21 is covered by the first insulation layer 32A, and by forming the gate electrode 43 on those sections of the second surface 102 in which the drain region 14 is covered by the second insulation layer 32B. Further, the optional carrier layer 110 is removed from the first surface 101 and the source electrode 41 is produced. The source electrode, the drain electrode and the gate electrodes are, for example, metal layers of aluminium, copper or another metal. According to an embodiment the gate electrode 43 and/or the drain electrode 42 are passivated using, for example, a PECVD process in which a passivation layer (not shown), like an oxide layer, a nitride layer, an imide layer, an epoxy layer, a resist layer or a polymer layer, is deposited on the gate and/or the drain electrode 43, 42. Further, the source electrode 41 can be mounted onto a carrier (not shown) using a soldering process, like a diffusion soldering process, or a glueing process.

The method illustrated in FIGS. 6A to 6E can easily be modified in order to produce the component of FIG. 4 that has gate trenches and at least one gate and connection trench. For producing the component according to FIG. 4 besides the at least one gate and connection trench (as shown in FIG. 6A) at least one gate trench is provided, wherein the gate trench does not extend as deep into the semiconductor body 100 as the gate and connection trench and wherein the gate trench only includes a section of the gate electrode 15 and optionally a first field electrode 17.

FIGS. 7A to 7H schematically illustrate an embodiment of a method for producing a gate and connection trench which includes a gate electrode section and a gate connection electrode 21. FIGS. 7A to 7H illustrate vertical cross sections through the semiconductor body 100 during the individual method steps.

Figures 7A, 7B:
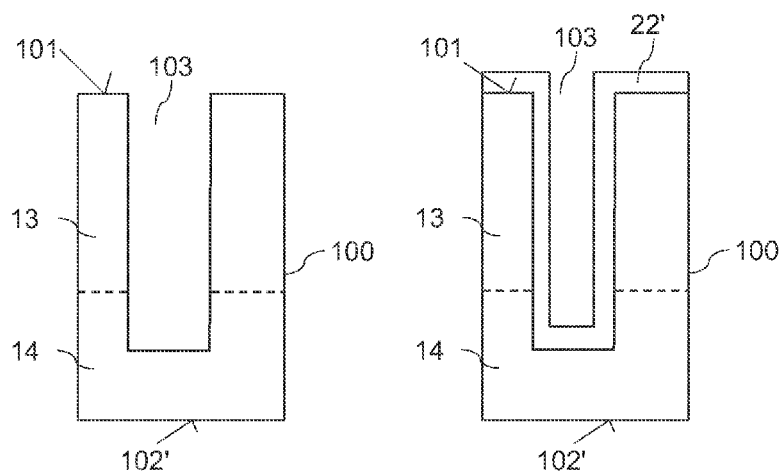

Referring to FIG. 7A a gate and connection trench 103 is formed that extends from the first surface 101 into the semiconductor body 100 and that does not extend to the second surface 102'. Referring to FIG. 7B a dielectric layer 22' is formed at the bottom and on sidewalls of the trench 103 and on the first surface 101 of the semiconductor body 100. Sections of this dielectric layer 22' at a later stage form the dielectric layer 22 which insulates the gate connection electrode 21 from the drift region 13. The dielectric layer 22' is, for example, an oxide layer, a nitride layer, or a composite layer including an oxide and a nitride. An oxide layer as the dielectric layer 22' can include a thermally grown oxide and/or a deposited oxide, like TEOS.

Figures 7C, 7D:
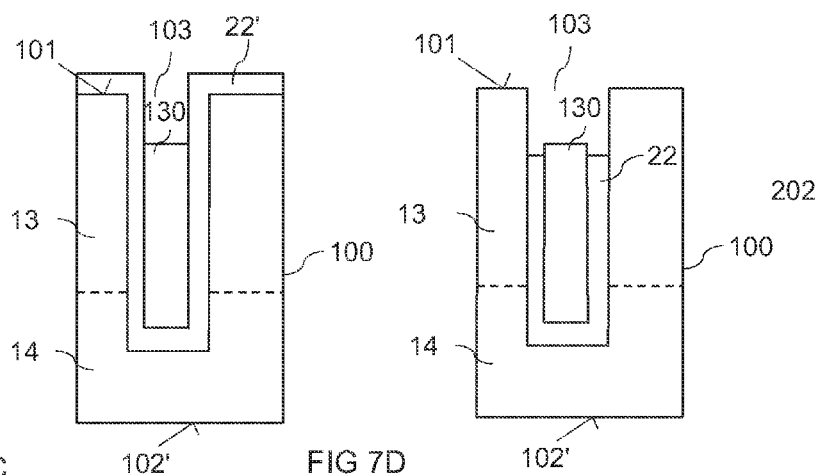

Referring to FIG. 7C the trench 103 is filled with an etch plug 130 up to a pre-defined height. The height of the plug 130 defines the later border between the gate electrode 15 and the gate connection electrode 21, which will become apparent from FIGS. 7D to 7H. The etch plug 130 is, for example, made of a polycrystalline semiconductor material, like polysilicon, or of a resist.

Referring to FIG. 7D the dielectric layer 22' is removed from the first surface 101 and from the sidewalls of upper portions of the trench 103 down to the surface of the plug 130 or down to slightly below the surface of the plug 130. Removing the dielectric layer 22' includes, for example, an etching process that etches the dielectric layer 22' selectively against the semiconductor body 100 and the etch plug 130. Those sections of the dielectric layer 22' that remain after the etching process form the dielectric layers 22 that insulate the gate connection electrode 21 from the drift region 13.

Referring to FIG. 7E the gate dielectric 16 is formed on the sidewalls of the trench 103 above the gate connection electrode dielectric layer 22, and, optionally, on the first surface 101. Producing the gate dielectric 16 includes, for example, a thermal oxidation process.

Referring to FIG. 7F the trench 103 is filled with an electrode material, wherein this electrode material in a lower portion of the trench 103 in which the connection electrode dielectric 22 is arranged along the sidewalls from the gate connection electrode 21 and in upper portion of the trench 103 in which the gate dielectric 16 is arranged along the sidewalls forms the gate electrode 15. Forming the gate connection electrode 21 and the gate electrode 15 can include completely filling the trench with an electrode material and etching back the electrode material down to a desired height level. In this embodiment the gate electrode 15 and the gate connection electrode 21 are integrally formed as one electrode. However, these electrodes could also be formed from different electrode materials by first producing the gate connection electrode 21 and then producing the gate electrode 15 above the gate connection electrode 21.

Referring to FIG. 7G a space in the trench 103 that results from etching back the electrode material is filled with an insulating material 31, like an oxide or a nitride, that serves to insulate the gate electrode 15 from the source electrode (41 in FIG. 1).

Referring to FIG. 7H the source and body regions 11, 12 are produced by, for example, implanting and/or diffusing dopants into the semiconductor body 100 via the first surface 101. The structure resulting from this corresponds to the structure illustrated in FIG. 6A.

Figure 8:
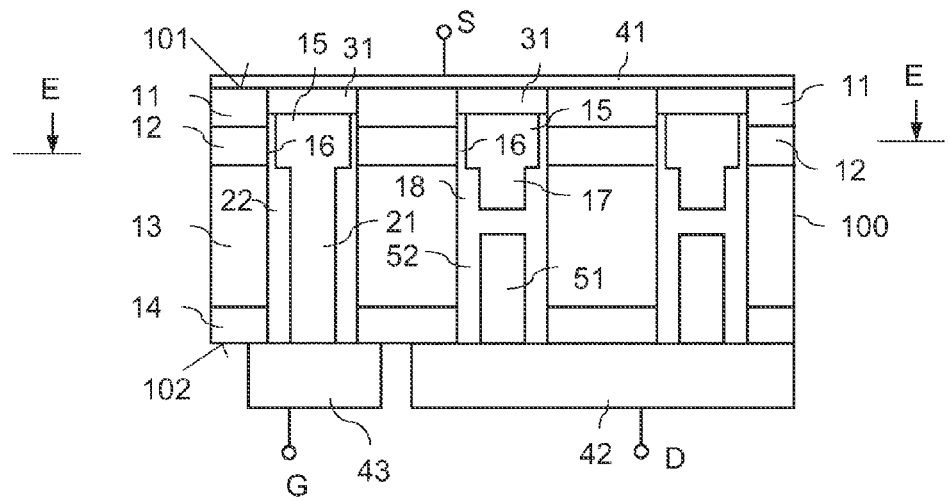
FIG. 8 schematically illustrates a vertical cross section through a vertical transistor component according to a third embodiment.

FIG. 8 illustrates a vertical cross section trough a further embodiment of a vertical transistor component which has a gate connection electrode 21 and which has a reduced gate-drain capacitance. This component includes at least one gate and connection trench with a gate electrode 15 and a gate connection electrode 21. This gate and connection trench corresponds to the gate and connection trenches explained with reference to FIGS. 1 to 7 hereinabove. This gate and connection trench can, for example, be produced with the method steps illustrated in FIGS. 7A to 7H.

The transistor component of FIG. 8 further includes gate trenches with sections of the gate electrode 15. Optionally a first field electrode 17 is arranged in the gate trenches below the gate electrode 15 and adjacent to the drift region 13. In the embodiment illustrated in FIG. 8 this first field electrode 17 is electrically connected with the gate electrode 15. However, this only an example, the field electrode 17 could also be connected with the source electrode 41. The gate trenches like the gate and connection trench extend from the first surface 101 to the second surface 102 of the semiconductor body 100. However, there is no connection electrode arranged in the gate trenches. Instead, the gate trenches include a second field electrode 51 which extends down to the second surface 102, is electrically connected with the drain electrode 42, and is electrically insulated from the first field electrode 17 and from the drift and drain regions 13, 14 by a dielectric layer 52. The gate electrode 15 can include a plurality of strip-like gate electrode sections that run parallel to one another in a horizontal plane of the semiconductor body 100, where each of these gate electrode sections is arranged in one of the gate trenches. These gate electrode sections can be electrically connected with one another and, in particular, with the gate electrode section in the gate and connection trench through a further gate connection electrode (15' in FIG. 5) in the manner illustrated in FIG. 5. The horizontal cross section illustrated in FIG. 5 does also represent a cross section through the semiconductor component of FIG. 8. It should be mentioned, however, that besides a gate electrode 15 with strip-like gate electrode sections a gate electrode 15 with any other geometry, like a grid-like geometry, can be used as well.

Figure 9:
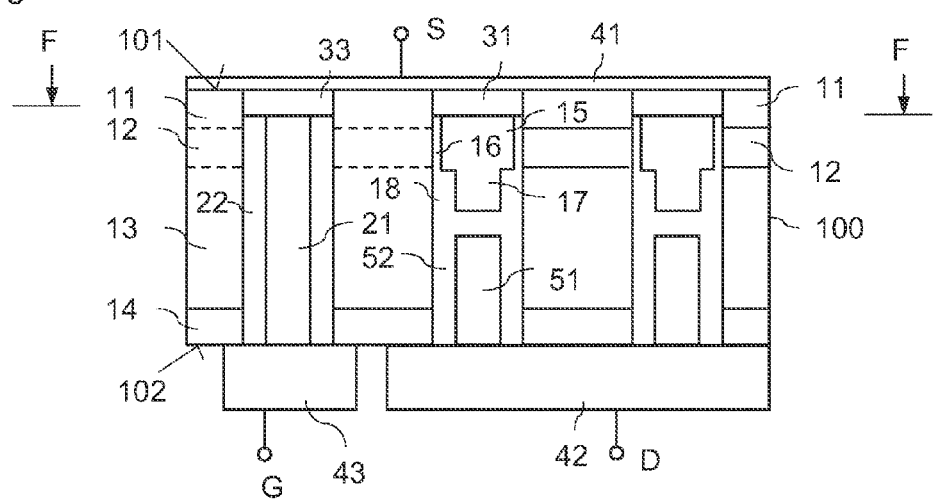
FIG. 9 schematically illustrates a vertical cross section through a vertical transistor component according to a fourth embodiment.
Figure 10:
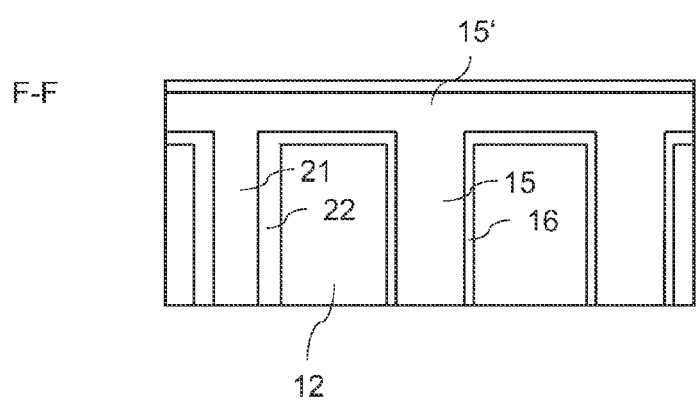
FIG. 10 illustrates a first embodiment of a gate electrode of the transistor component of FIG. 9 by means of a horizontal cross section through the gate electrode.

FIG. 9 illustrates a vertical transistor component which is modified compared with the transistor component of FIG. 8. Referring to FIG. 9 the transistor component includes gate trenches which each include a section of the gate electrode 15, an optional first field electrode 17 and a second field electrode 51, the latter being connected to the drain electrode 42. The first field electrode 17 is either connected to the gate electrode (as illustrated) or to the source electrode (not illustrated). The component further includes a connection trench with the gate connection electrode 21 which extends down to the second surface 102 and is connected to the gate contact electrode 43, but without a gate electrode section arranged in the connection trench. The gate connection electrode 21 is electrically insulated from the source electrode 41 by an insulation or dielectric layer 33. The gate electrode sections 15 arranged in the gate trenches are electrically connected with the gate connection electrode 21 in the connection trench. For this purpose the component can include a further connection electrode 15' which electrically connects the gate electrode sections in the gate trenches with the connection electrode 21 in the connection trench. Such further connection electrode 15' is illustrated in FIG. 10 which shows a horizontal cross section through the component of FIG. 9 in a horizontal section plane F-F. Of course, in the component according to FIG. 9 as well as in the component illustrated hereinabove several of the such further connection electrodes 15' can be provided that connect the gate electrode sections 15 in gate trenches with the gate electrode section 15 or the connection electrode 21 in a gate and connection trench or a connection trench, respectively.

Figure 11:
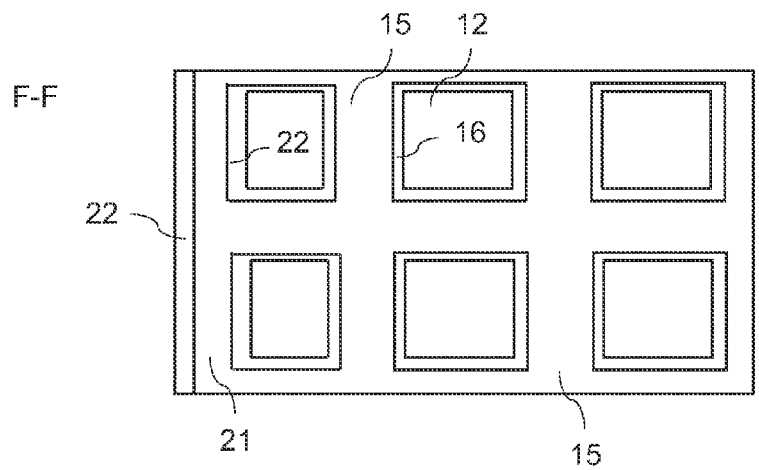
FIG. 11 illustrates a second embodiment of a gate electrode of the transistor component of FIG. 9 by means of a horizontal cross section through the gate electrode.

Alternatively, the gate electrode has a grid-like geometry and is connected to the gate connection electrode 21. FIG. 11 illustrates a horizontal cross section in the section plane F-F of the component of FIG. 9 in which the gate electrode 15 has a grid-like geometry and is electrically connected with the connection electrode 21 at several positions. Of course, such grid-like gate electrodes 15 can also be provided in the vertical transistor components illustrated hereinabove.

Figure 12:
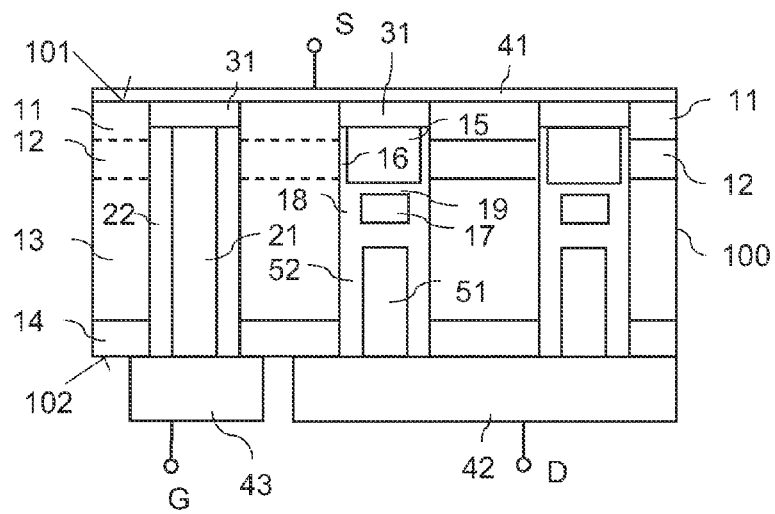
FIG. 12 illustrates a vertical cross section through a vertical transistor component according to a fifth embodiment.

FIG. 12 illustrates a modification of the vertical transistor component of FIG. 9. In this transistor component the first field electrode 17 is electrically insulated from the gate electrodes 15 by a dielectric layer 19 and in a manner not illustrated in detail is electrically connected to the source electrode 41. The dielectric layer 19 can be of the same material as the gate dielectric 16 and can be produced by the method steps that form the gate dielectric 16.

In order to electrically connect the first field electrode 17 to the source electrode 41 the first field electrode 17 at a position that is not illustrated in FIG. 12 extends to the first surface 101 electrically insulated from the gate electrode 15. According to a further embodiment a via which is electrically insulated from the gate electrode 15 extends through the gate electrode 15 from the first surface 101 down to the first field electrode 17 in order to electrically connect the first field electrode 17 to the source electrode 41.

Figure 13:
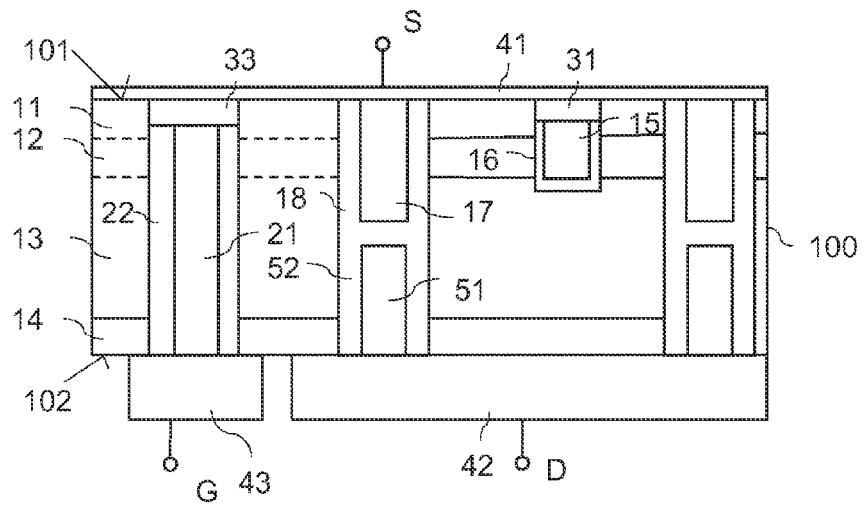
FIG. 13 illustrates a vertical cross section through a vertical transistor component according to a sixth embodiment.

FIG. 13 illustrates a further modification of the transistor component of FIG. 9. This transistor component includes gate trenches (wherein only one gate trench illustrated in FIG. 13) in which only the gate electrode 15 or the gate electrode sections are arranged, and field electrode trenches in which the first and second field electrodes 17, 51 are arranged. The gate trenches and the field electrode trenches are arranged distant to one another in a horizontal direction of the semiconductor body. The gate electrode sections 15 in the gate trenches are electrically connected with the gate connection electrode 21 in the connection trench in a manner not illustrated in detail in FIG. 13. In the field electrode trenches the first field electrode 17 extends to the first surface 101 and is electrically connected to the source electrode 41 and the second field electrode 51 extends to the surface 102 and is electrically connected to the drain electrode 42. The first and second field electrodes 17, 51 are electrically insulated from one another by the dielectric layer 52.

An embodiment of a method for producing the vertical transistor component of FIG. 12 which includes a connection trench with a gate connection electrode 21 and gate trenches with the gate electrode 15 and first and second field electrodes 17, 51 will now be explained with reference to FIGS. 14A to 14I. In these figures method steps for producing one connection trench and one gate trench is illustrated.

Figure 14A:
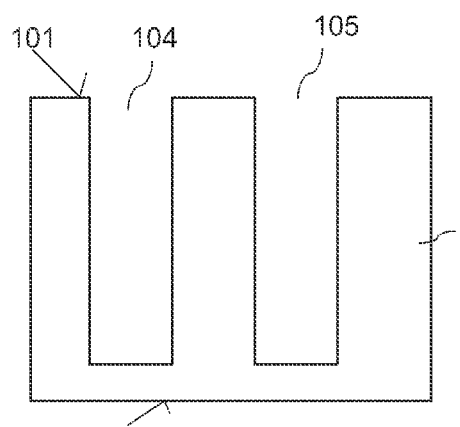
FIGS. 14A to 14I illustrates method steps for producing the vertical transistor component of FIG. 12.

Referring to FIG. 14A first and second trenches 104, 105 are produced to extend from the first surface 101 into the semiconductor body 100. The first trench 104 is the trench in which the connection electrode 21 is to be produced, and the second trench 105 is the trench in which the gate electrode 15 is to be produced. These trenches 104, 105 do not yet attend to a second surface 102' of the semiconductor body 100, wherein the second surface 102' illustrated in FIG. 14A is not the second surface of the completed transistor component.

Figure 14B:
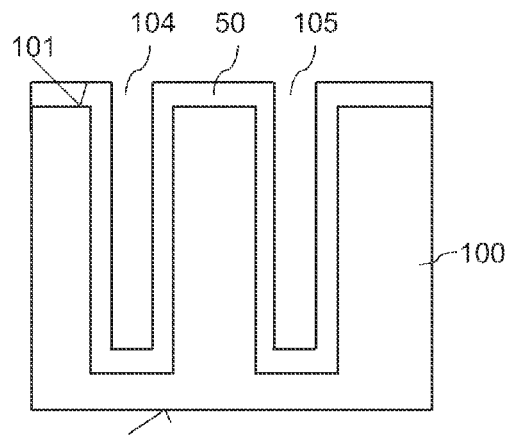

Referring to FIG. 14B a dielectric layer 50 is formed on the sidewalls and the bottom of each of the trenches 104, 105 and on the first surface 101 of the semiconductor body 100. The dielectric layer 50 includes, for example, at least one of a nitride layer or an oxide layer, wherein the oxide layer can be a thermally grown and/or a deposited oxide layer.

Figure 14C:
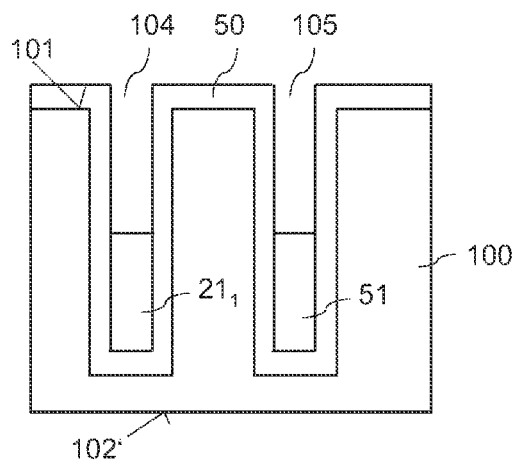

Referring to FIG. 14C a first section $21_1$ of the connection electrode is produced in the first trench 104, and the second field electrode 51 is produced in the second trench 105. These electrodes $21_1$, 51 are produced by common method steps that, for example, include: the deposition of an electrode layer on the dielectric layer 50 such that the electric layer completely fills the trenches 104, 105; and etching back the electrode layer in the first and second trenches 104, 105 down to a desired level. At the end of this process step the first section $21_1$ of the gate connection electrode and the second field electrode 51 have identical or approximately identical height levels. The material of the electrodes $21_1$, 51 is, for example, a metal or a doped polycrystalline semiconductor material, such as polysilicon.

Figure 14D:
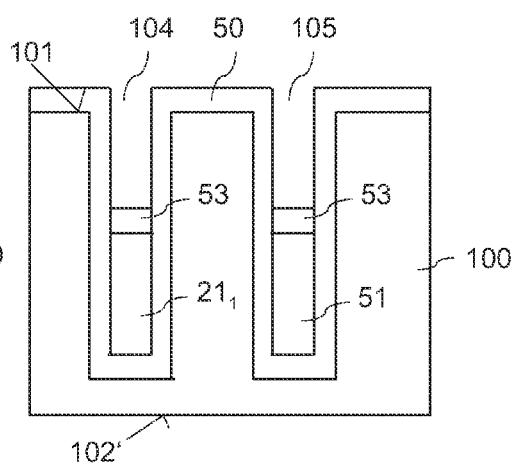
Figure 14E:
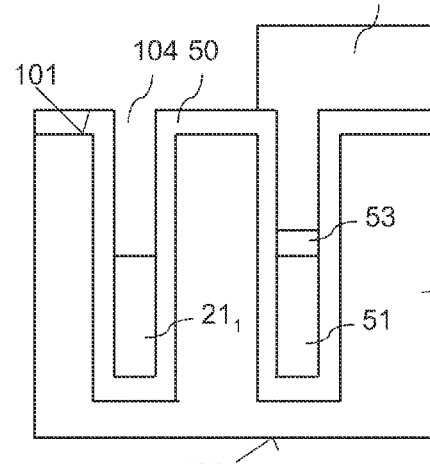

Referring to FIG. 14E a dielectric layer 53 which separates the second field electrode 51 from the first field electrode 17 in the completed transistor component is produced on the second field electrode 51. This dielectric layer 53 includes, for example, at least one of a nitride layer or an oxide layer, wherein the oxide layer can be a thermally grown and/or a deposited oxide. Optionally a nitride liner (not shown) is produced on the dielectric layer 50 and on the electrodes $21_1$, 51 in the first and second trenches 104, 105 before producing the dielectric layers 53. Producing this dielectric layer 53 includes, for example, producing dielectric layers 53 on the first section $21_1$ of the gate connection electrode and on the second field electrode 51, as illustrated in FIG. 14D, and removing the dielectric layer 53 from the first section $21_1$ of the gate connection electrode 21. The removal of the dielectric layer 53 from the first gate connection electrode section $21_1$ is, for example, performed using an etching process supported by an etch mask 201 that covers the dielectric layer 53 on the second field electrode 51 and that leaves the dielectric layer 53 on the first gate connection electrode section $21_1$ uncovered. After the etching process the etch mask 201 is removed.

Figure 14F:
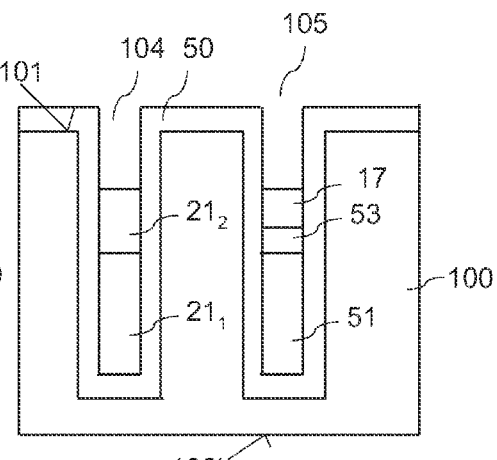

Referring to FIG. 14F a second section $21_2$ of the first connection electrode is produced on the first section $21_1$ and the first field electrode 17 is produced on the first field electrode dielectric 53 in the second trench 105. The second gate connection electrode section $21_2$ and the first field electrode 17 are, for example, produced using common method steps that can include the deposition of an electrode layer which completely fills the trenches 104, 105, and etching back the electrode material down to desired height levels in the first and second trenches 104, 105. The second connection electrode section $21_2$ and the first field electrode 17 in the first and second trenches 104, 105 have different height levels, i.e. the first field electrode 17 extends further in the direction of the first surface 101 than the second gate connection electrode section $21_2$.

Figure 14G:
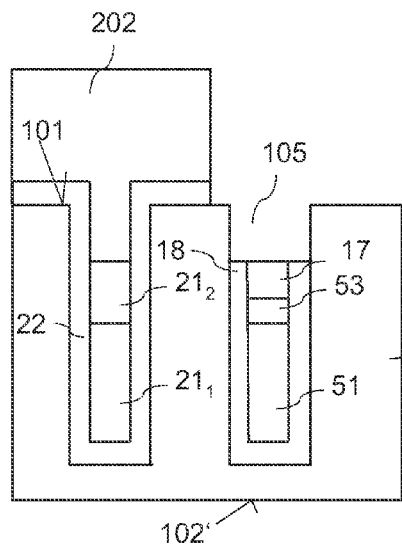
Figure 14H:
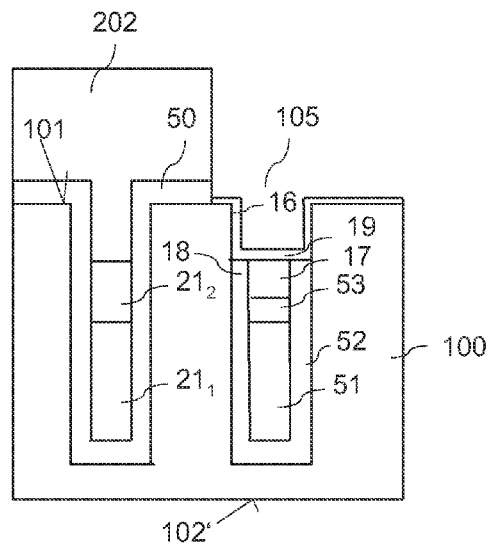

Referring to FIGS. 14G and 14H the dielectric layer 50 is removed from an upper portion of the second trench 105 down to the first field electrode 16. The remaining sections of the dielectric layer 50 in the second trench 105 forms the dielectric layer 18, 52 that electrically insulate the first and second field electrodes 17, 51 from the semiconductor body, in particular from those regions of the semiconductor body 100 in which the drift region 13 and the drain region 14, respectively, in the completed component is arranged. The dielectric layer 50 remains in the first trench 104 and in the first trench forms the dielectric layer 22 that in the completed component electrically insulates the gate connection electrode 21 from the semiconductor body 100. Removing the dielectric layer 50 from the upper portion of the second trench 105 includes, for example, an etching process which is supported by an etch mask 202 that covers dielectric layer 50 in the first trench 104 during the etching process. The result of the etching process is illustrated in FIG. 14G.

Referring to FIG. 14H the gate dielectric 16 and the dielectric layer 19 which separates the first field electrode 17 from the gate electrode 15 are produced in next method steps. The gate dielectric 16 and the dielectric layer 19 are, for example, produced by a common method step that includes producing a dielectric layer on the sidewalls and the bottom of the remaining second trench 105. The dielectric layer is, for example, an oxide layer like a thermally grown oxide layer, but can include any other suitable gate dielectric layer as well.

The etch mask 202 can be removed after the etching process and before producing the gate dielectric 16 and the dielectric layer 19, or can be removed after producing these dielectric layers 16, 19.

Figure 14I:
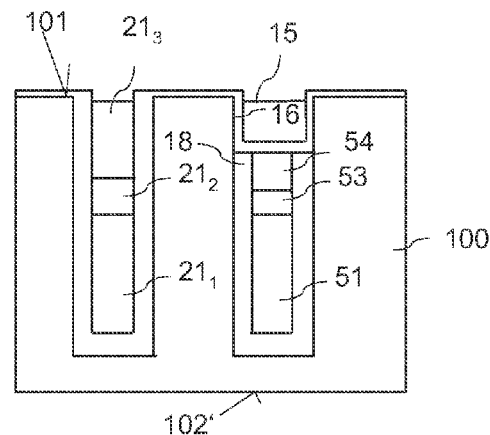

Referring to FIG. 14I a third section $21_3$ of the gate connection electrode is produced in the first trench on top of the second section $21_2$, and the gate electrode 15 is produced in the second trench 105. These electrodes $21_3$, 15 can be produced using common method steps which, for example, can include: depositing an electrode layer in the first and second trenches 104, 105 which completely fills these trenches and on the dielectric layers 50 above the first surface 101; planarizing the semiconductor body 100 in order to uncover the first surface 101; and etching the electrode layer in the first and second trenches 104, 105 down to a desired height level. In the embodiment illustrated in FIG. 14I the third section $21_3$ of the gate connection electrode and the gate electrode 15 are below the first surface 101, leaving a space for the insulation layers (31, 33 in FIG. 8) which in the completed component insulate the gate connection electrode and the gate electrode 15 against the source electrode (41 in FIG. 8).

Further method steps, that complete the component and that, in particular, include producing the source and body regions 11, 12 and the source electrode 41 can correspond to the method steps illustrated in FIG. 7H to which reference is made. And method steps that relate to the processing of the second surface 102 surface 102' and producing the drain and gate contact electrodes 42, 43 can correspond to the method steps explained in FIGS. 6A to 6E to which reference is made.

Figure 15A:
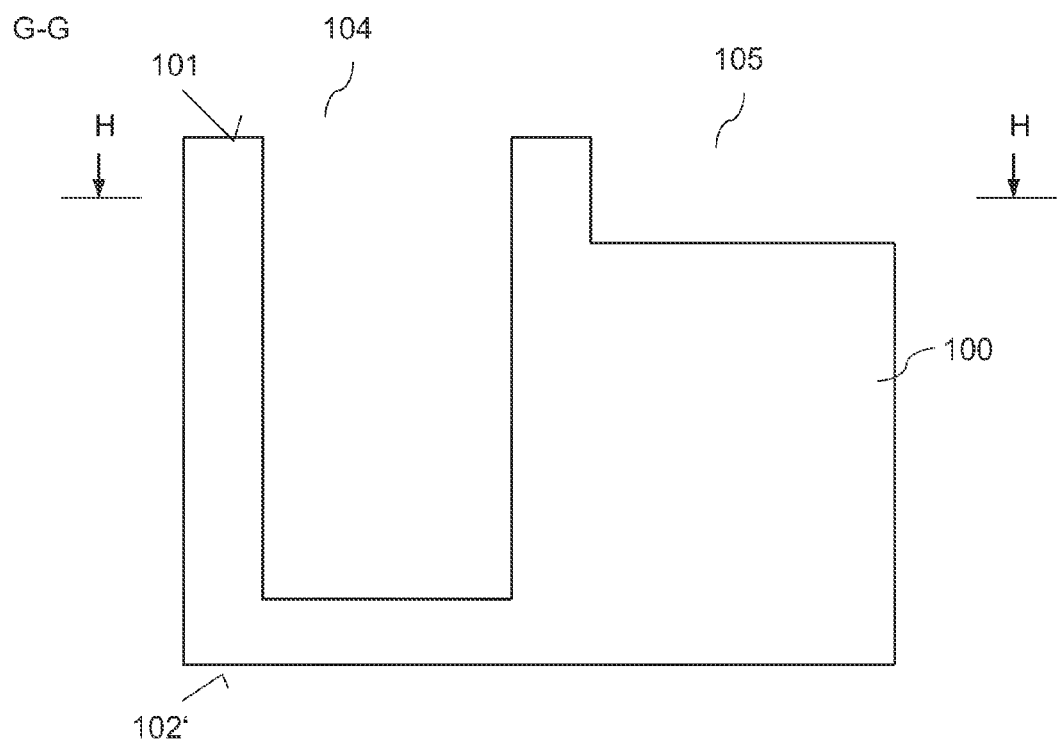
FIGS. 15A to 15P illustrates method steps for producing a vertical transistor component according to a seventh embodiment.
Figure 15B:
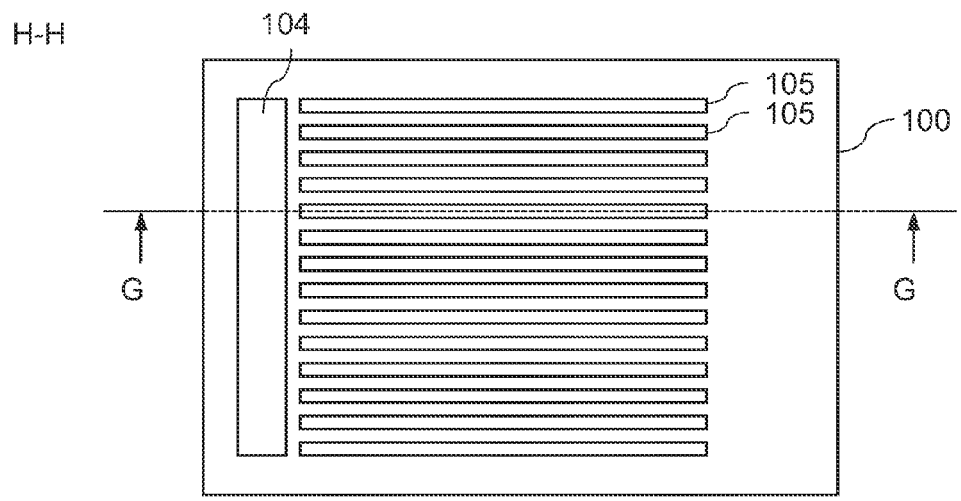
FIG. 15 which includes

A further embodiment of a method for producing a vertical transistor component with at least one connection trench which includes a gate connection electrode 21, and at least one gate trench which includes a gate electrode 15 will be explained with reference to FIGS. 15A to 15P. FIG. 15A illustrates a vertical cross section in a vertical section plane G-G through the semiconductor body 100 after first method step. During these method steps a first trench 104 for accommodating the gate connection electrode 21 and at least one second trench 105 for accommodating the gate electrode 15 are produced. Referring to FIG. 15B, which illustrates a horizontal cross section through the semiconductor body 100 in a horizontal section plane H-H second trenches 105 extend perpendicular to the first trench 104 in the horizontal plane. Instead of providing a plurality of parallel second gate trenches 105 a grid-like gate trench 105 could be provided as well. In FIG. 15A only a section of one second trench 105 is illustrated.

Producing the first and second trenches 104, 105 can include commonly known processes for producing trenches in semiconductor bodies, like etching processes using etch masks. The first and second trenches 104, 105 are generated such that they are arranged distant to one another in the horizontal direction.

Figure 15C:
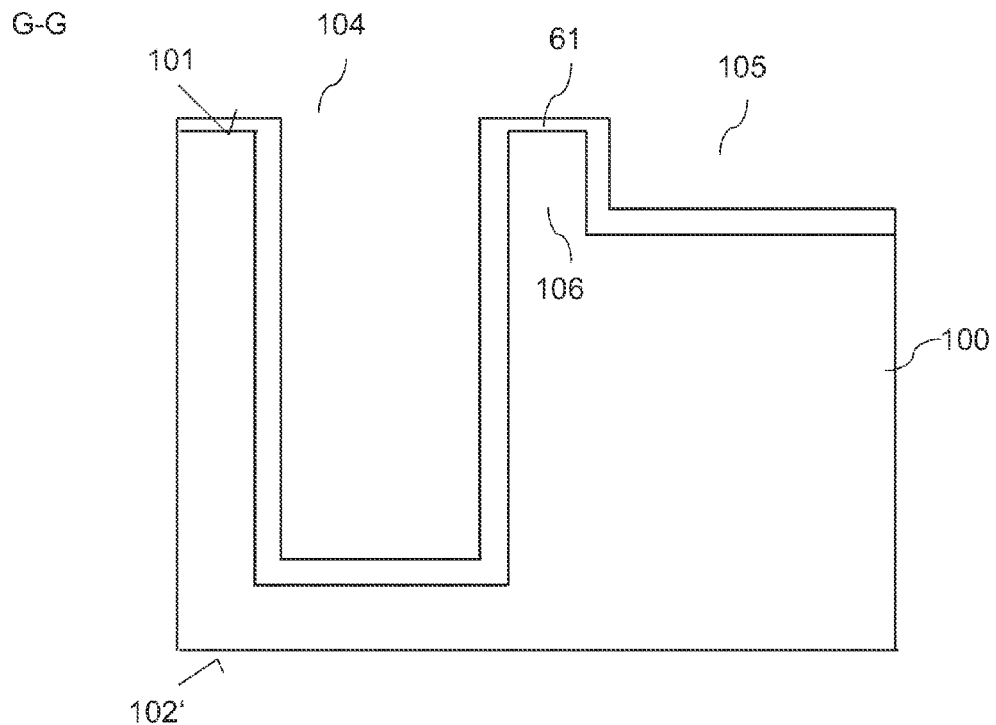

Referring to FIG. 15C a dielectric layer 61 is produced on the sidewalls and the bottom of each of the first and second trenches 104, 105 and at least on top of a mesa region 106. The "mesa region" 106 is the region of the semiconductor body 100 between the first and second trenches 104, 105. The dielectric layer 61 includes, for example, at least one of a nitride layer and an oxide layer, wherein the oxide layer can include a thermally grown and/or deposited oxide.

Figure 15D:
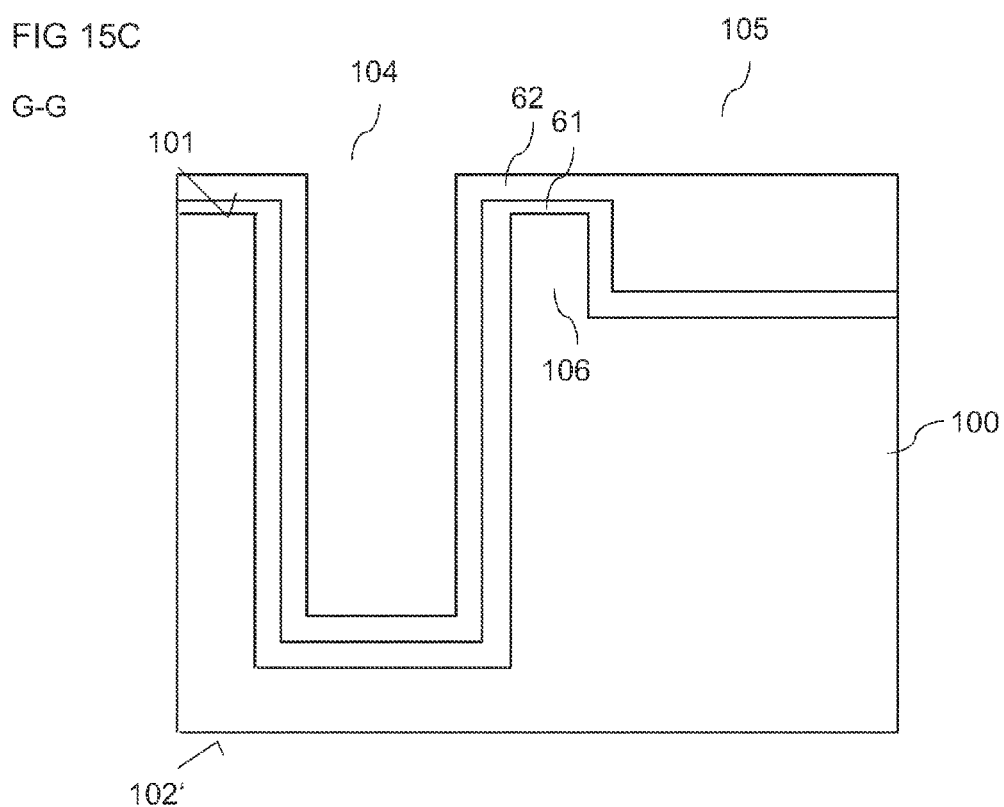

Referring to FIG. 15D an electrode layer 62 is produced on the dielectric layer 61. The electrode layer 62 is, for example, a metal layer or a doped polycrystalline semiconductor layer, like a polysilicon layer.

Figure 15E:
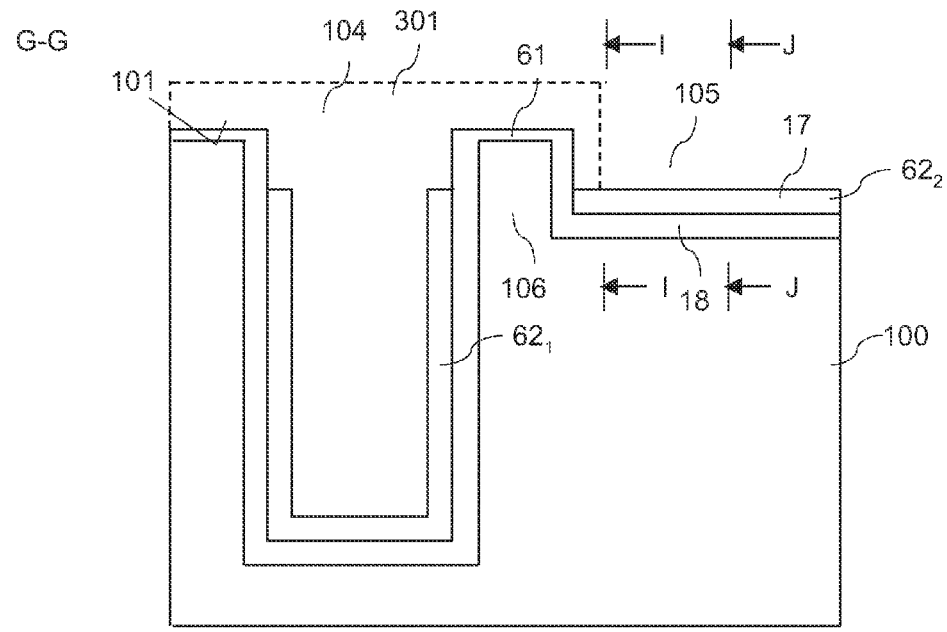

Referring to FIG. 15E the electrode layer 62 is separated into two sections: A first section $62_1$ arranged in the first trench 104, and a second section $62_2$ arranged in the at least one second trench 105. A width of the first trench 104 and a width of the second trench 105 and a layer thickness of the electrode layer 62 are adapted to one another such that the electrode layer 62 in the first trench 104 only covers the sidewalls and the bottom of the first trench 104 but does not completely fill the first trench 104, and in the second trench 105 completely fills the second trench 105, before separating the electrode layer 62 into the two sections $62_1$, $62_2$. Separating the electrode layer 62 into two pieces includes removing at least those sections of the electrode layer 62 arranged on top of the mesa region 106. This removal process can include an isotropically etching process. This etching process is performed such that it also etches the electrode material in the second trench 105 down to a desired level. The second section $62_2$ of the electrode layer that remains in the second trench 105 after this etching process forms the first field electrode 17 in the completed transistor component, while those sections of the dielectric layer 61 arranged between the first field electrode 17 and the semiconductor body 100 forms the field electrode dielectric 18. A part of the dielectric layer $62_1$ can remain at the bottom of the first trench 104 (like illustrated). This is in particular the case when an etching process for etching the dielectric layer 61 (see FIG. 15F) is applied that has an etch rate which decreases with increasing trench depth, i.e. when layers in deep trenches, like layer $62_1$ in the first trench 104, are etched with a lower etch rate than layer in shallow trenches, like layer $62_2$ in the second trench 105. It is, however, also possible to completely remove the dielectric layer $62_1$ from the bottom of the first trench 104.

Figure 15F:
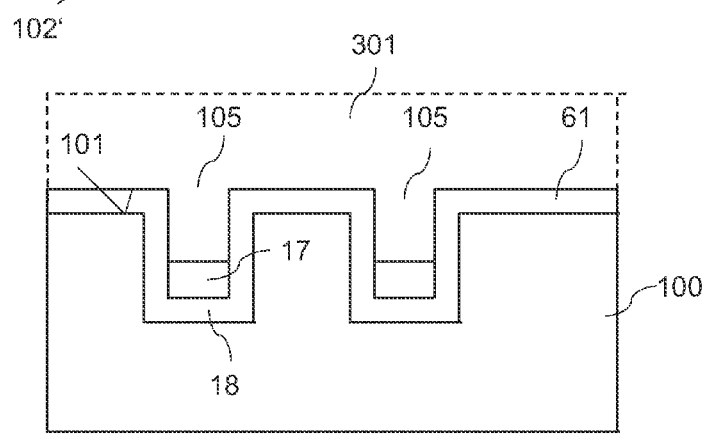
Figure 15G:
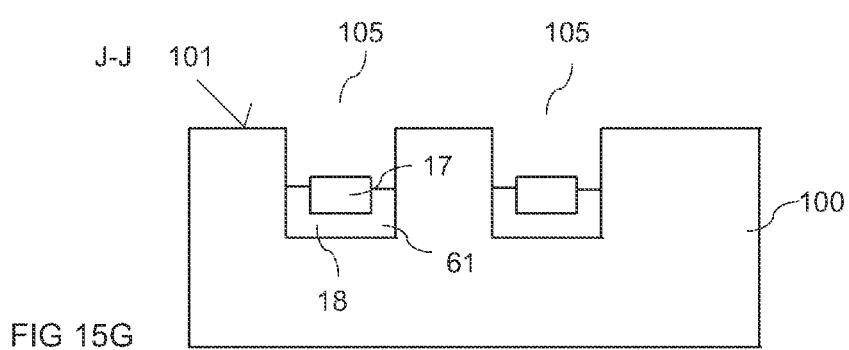

FIG. 15F which illustrates a cross section through the semiconductor body 100 in a vertical section plane I-I shows a cross section through the second trenches 105 after the etching process. In the next method steps the dielectric layer 61 in the second trench 105 is removed from the sidewalls of the second trenches 105 down to the surface of the first field electrode 17 or below the surface of the field electrode. FIG. 15G, which shows a vertical cross section through this semiconductor body 100 in a vertical section plane J-J shows the semiconductor body after this removal process. During the etching process the dielectric layer 61 in the first trench 104 is protected by a mask or etch protection layer 301 which is illustrated in dashed lines in FIG. 15E. This protection layer 301 can be produced such that it only covers first trench 104 and the mesa region 106, or can be produced such that it also covers sections of the second trenches 105 adjacent to the mesa region 106, as it is illustrated in FIG. 15E. In this case the dielectric layer 61 remains on the sidewall of the second trenches 105 in those sections covered by the protection layer 301. The cross section illustrated in FIG. 15F represents a cross section through the second trenches 105 in those sections covered by the masking layer 301, and the cross section illustrated in FIG. 15G represents a cross section represents a cross section through a region (section plane J-J) not covered by the mask layer 301.

Figure 15H:
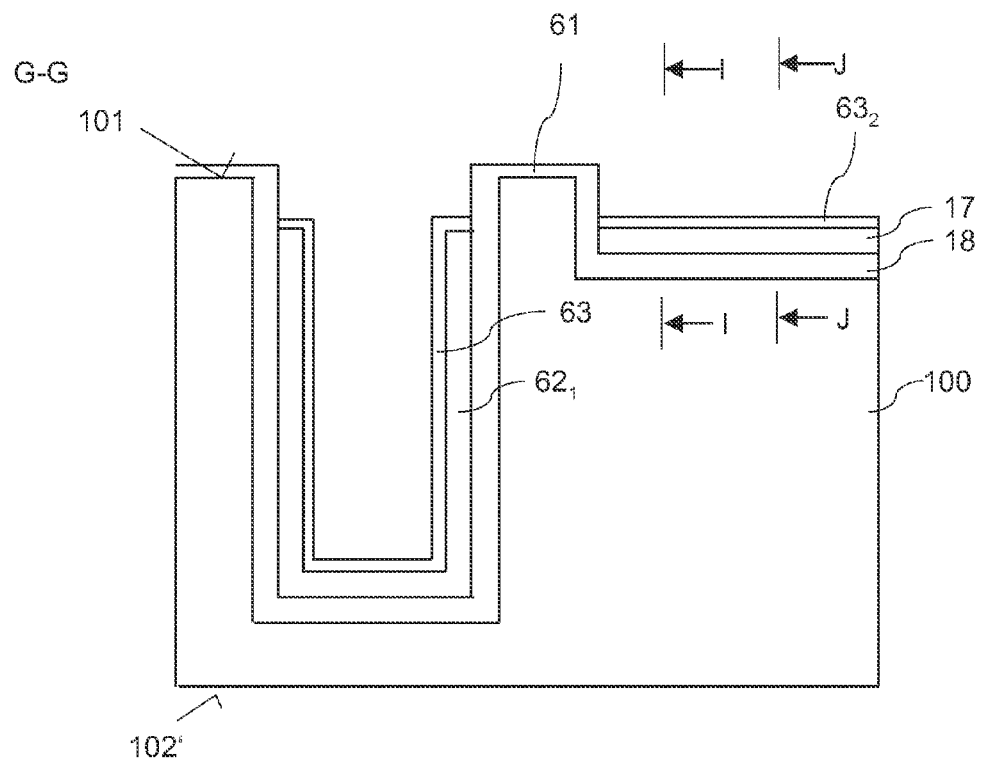
Figure 15I:
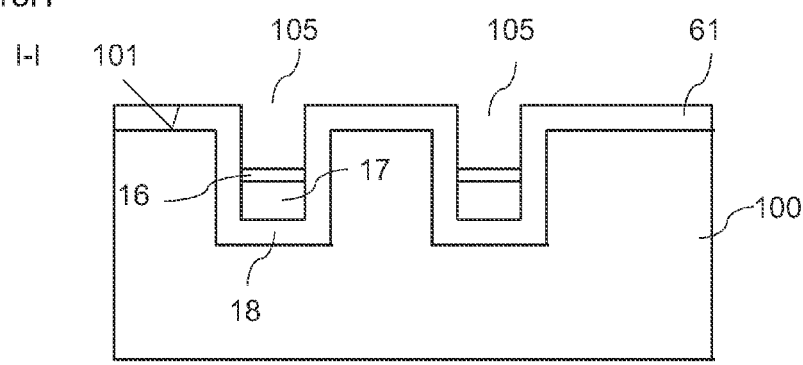
Figure 15J:
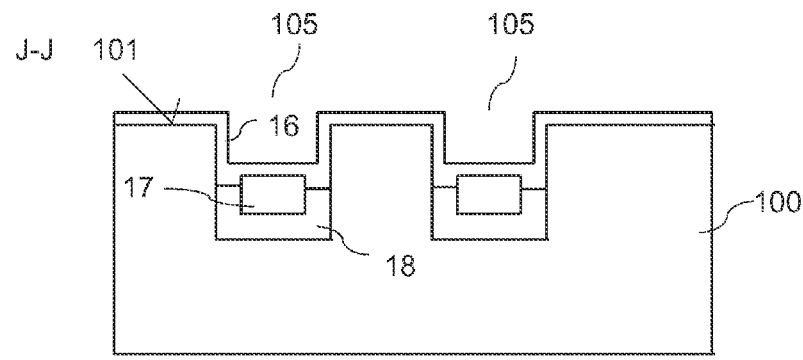

Referring to FIGS. 15H to 15J, the gate dielectric 16 is formed in the second trenches 105 on the first field electrode 17 and along the sidewalls in those sections of the second trenches 105 that were not covered by the mask layer 301 (FIGS. 15E and 15F). Referring to FIG. 15I the gate dielectric 16 in those regions that were previously covered by the mask layer 301 is only produced on the first field electrode 17, and referring to FIG. 15J, the gate dielectric 16 in those sections that were not covered by the mask layer 301 are produced on the first field electrode 16 and on the sidewalls of the trenches 105 as well as on the first surface 101. In the second trenches 105 gate dielectric 16 also separates the first field electrode 17 from the gate electrode. The gate dielectric 16 includes, for example, at least one of a nitride layer and an oxide layer.

Producing the gate dielectric 16 can include method steps that also produce a dielectric layer 63 on the electrode layer $62_1$ in the first trench 104. This dielectric layer 63 is shown in FIG. 15H. However, production of this dielectric layer can be prevented by forming a mask layer (not shown) on the first trench 104 during the steps of producing the gate dielectric 16.

Figure 15K:
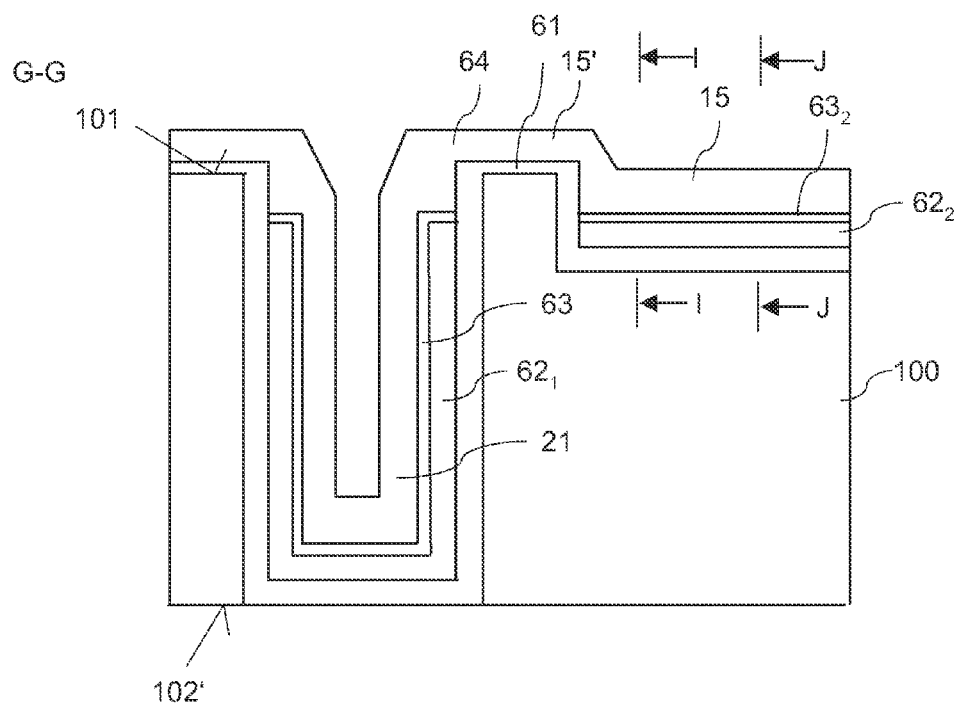

Referring to FIG. 15K a further electrode layer 64 is deposited above the first surface 101 of the arrangement. This electrode layer 64 completely fills the second trenches 105 and forms the gate electrode 15 in these trenches 105. The electrode layer 64 further covers the sidewalls and the bottom of the first trench 104, but does not necessarily completely fill the first trench 104. However, according to one embodiment the electrode layer 64 also completely fills the first trench 104. In the first trench 104 the electrode layer 64 forms the gate connection electrode 21, which will become apparent from FIG. 15O further below. The sections of the electrode layer 64 which form the gate electrode 15 in the second trenches 105 and the section of the electrode layer 64 which forms the gate connection electrode 21 in the first trench 104 are connected with each other by a section of the electrode layer 64 that is arranged above the mesa region 106. This section of the electrode layer 64 forms a further connection electrode 15' that connects the gate electrode 15 to the gate connection electrode 21.

Figure 15L:
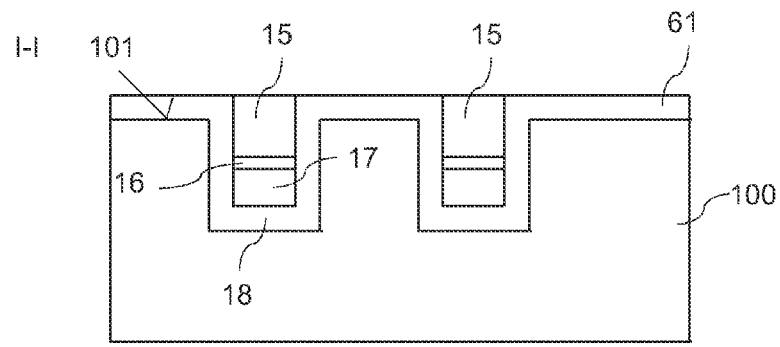
Figure 15M:
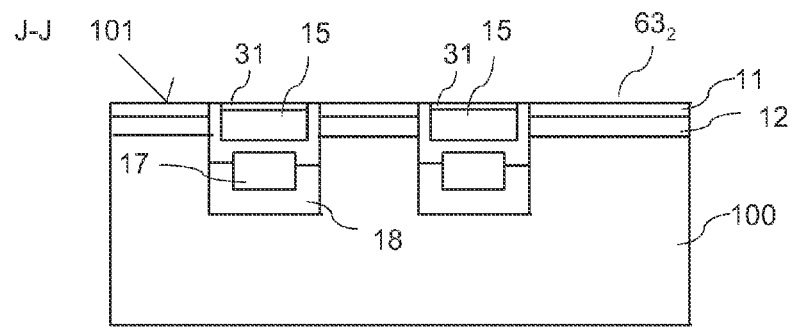

In those regions of the second trenches 105 in which a gate dielectric 16 is produced on the sidewalls of the second trenches 105 further method steps are performed, which are illustrated in detail in FIG. 15M, which illustrates a vertical cross section in section plane J-J. These method steps include etching back the gate electrode 15 below the first surface 101, producing an insulation layer 31 on the gate electrode 15, implanting and/or diffusing dopants into the first surface 101 in order to produce the source and body regions 11, 12. FIG. 15M illustrates a vertical cross section through the second trenches 105 after these method steps.

At least in the region of those sidewalls of the second trenches 105 that face in the direction of the first trench 104 the electrode layer 64 is not etched back in order to obtain the connection electrode 15' which connects the gate electrode 15 and the gate connection electrode 21. In the embodiment illustrated in FIG. 15K this is the region of the second trenches 105 in which the thicker dielectric layer remains along the sidewalls of the second trenches 105. A vertical cross section through section plane I-I in this section is illustrated in FIG. 15L.

Figure 15N:
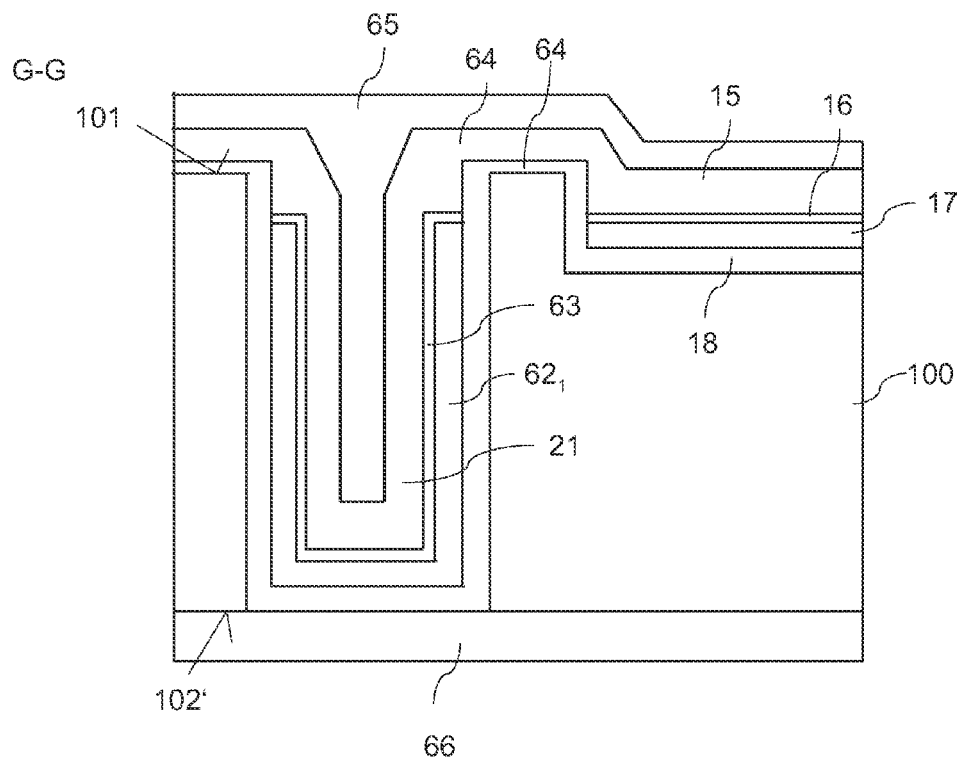

Referring to FIG. 15N a passivation layer 65, like an oxide layer, is deposited on the overall arrangement. This passivation layer 65 fills the first trench 104 in those cases in which the first trench is not completely filled by the electrode layer 64. Further, semiconductor material is removed from the second surface 102' of the semiconductor body 100 down to at least the dielectric layer 61 at the bottom of the first trench 104. According to a further embodiment, at least the dielectric layer 61, or even the layers $62_1$ and 63, are removed at the bottom of the trench together with semiconductor material of the semiconductor body 100 using, for example, a polishing process, like a CMP process. Optionally, a second passivation layer 66 is arranged on the second surface 102 obtained after the removal process.

Figure 15O:
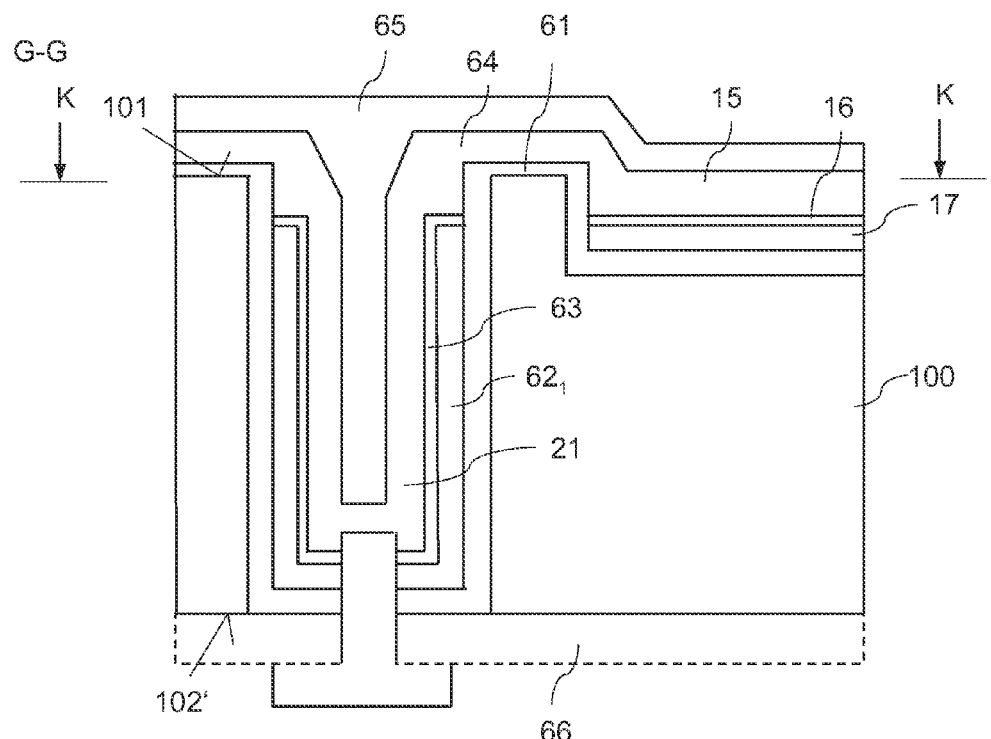

Referring to FIG. 15O a contact plug is produced which extends through the optional passivation layer 62 and through the layer stack with the dielectric layer 61, the electrode layer $62_1$ and the further optional dielectric layer $63_1$ to the gate connection electrode 21 in the first trench 104. The contact plug forms the gate contact electrode of the component. The component further includes a source electrode and a drain electrode. However, these electrodes are not shown in the cross section illustrated in FIG. 15O, these electrodes are arranged further to the right in FIG. 15O where the active regions of the transistor component with the body and source regions and the drain region are arranged.

Figure 15P:
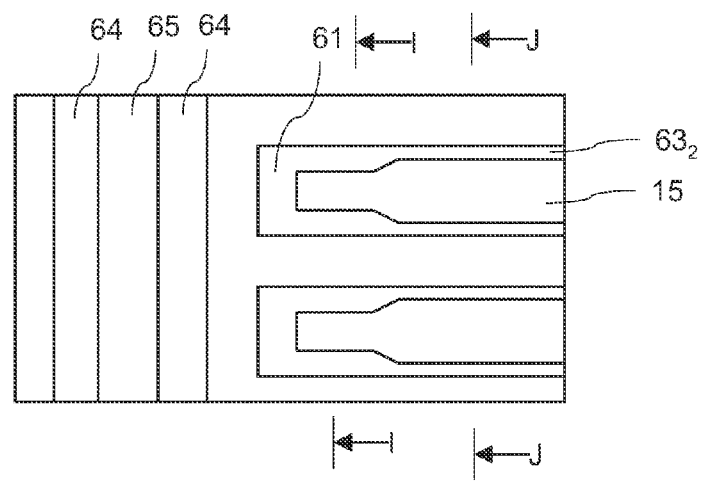

FIG. 15P shows a horizontal cross section through the semiconductor component of FIG. 15O in a horizontal section plane K-K. This horizontal cross section in particular shows those section of the second trenches 105 in which the thicker dielectric layer 61 remains after the method steps illustrated in FIGS. 15E to 15G.

In the component illustrated in FIG. 15O the first field electrode in a manner not illustrated in detail is electrically connected with the source electrode. Such electrical connection can, for example, be produced by producing sections of the first field electrode 17 which extends to the first surface 101 and which are electrically insulated from the gate electrode. For this, sections of the electrode layer 62 (FIG. 15D) are, for example protected from being etched back in the method steps illustrated in FIGS. 15E to 15G. These sections are, for example arranged at an end of the second trenches 105 that faces away from the first trench.

Figure 16:
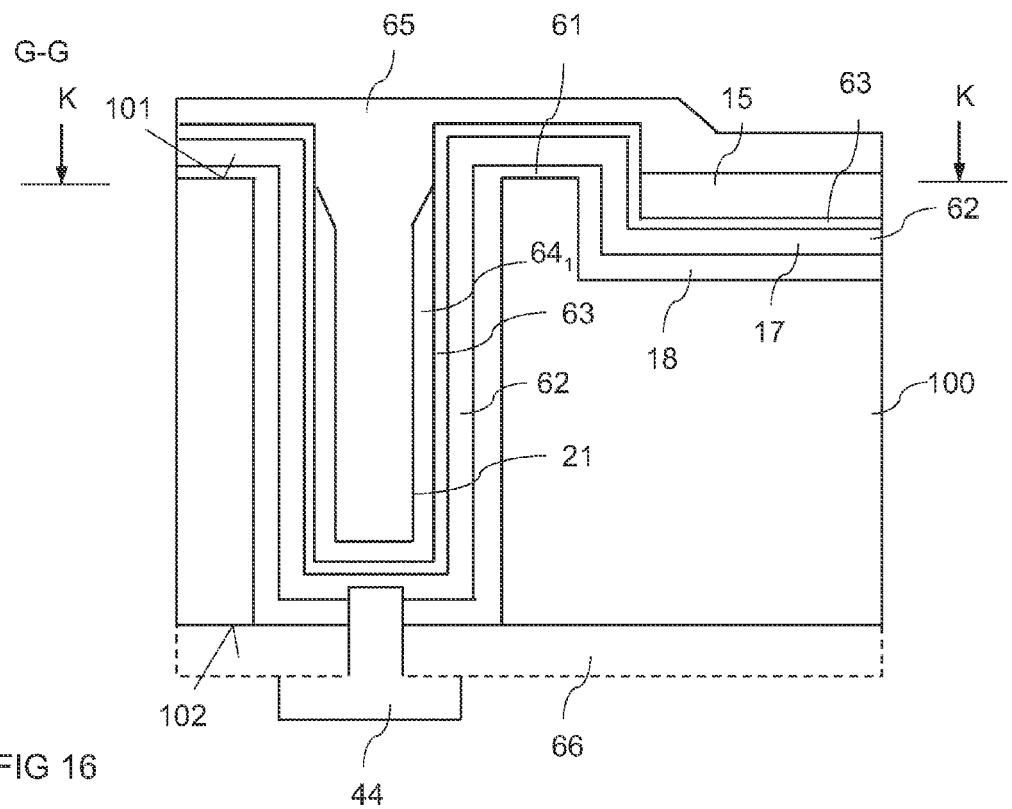
FIG. 16 illustrates a vertical cross section through a vertical transistor component according to an eighth embodiment.

FIG. 16 illustrates a vertical cross section through a semiconductor component according to a further embodiment. In this semiconductor component the first electrode layer 62 is not separated into two sections but extends in the first trench 104 as well as in the second trenches 105 and is electrically connected by a contact plug 44 which is arranged above the second surface 102 of the semiconductor body 100. The first electrode layer 62, which in the second trenches 105 acts as a first field electrode 17 (see FIG. 15M) is, for example, electrically connected to the source electrode (not shown in FIG. 16). In the semiconductor component of FIG. 16 an electrical connection to the source electrode can be provided at the second surface 102 of the semiconductor component via the contact plug 44 and the electrode layer 62. The gate electrode 15 does not extend into the second trench, i.e. an electrode layer that forms the gate electrode (layer 64 in FIG. 15K) is separated into two pieces, i.e. the gate electrode 15 in the first trenches and an electrode layer $64_1$ in the first trench 104, or is not produced in the first trench 104 at all. Like in the embodiment illustrated in FIG. 15 the at least one second trench 105 extends perpendicular to the first trench 104 or has a grid-like geometry.

The vertical transistor component of FIG. 16 can be obtained by the method steps illustrated in FIG. 15A to 15P with the difference that the first electrode layer 62 is not separated into two sections and that instead the second electrode layer, which in the component according to FIG. 15 forms the gate electrode 15 and the gate connection electrode 21 is separated into two pieces by removing the electrode layer from sections above the mesa region 106, or by not producing an electrode corresponding to the gate electrode 15 in the first trench 104 at all.

Figure 17A:
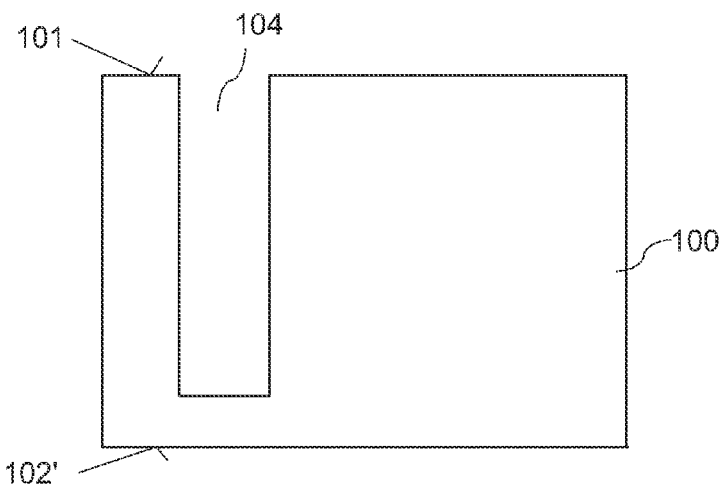
FIGS. 17A to 17L illustrates method steps for producing a vertical transistor component according to a ninth embodiment.

FIGS. 17A to 17L illustrate a further embodiment of a method for producing a vertical transistor component with a connection trench that includes a gate connection electrode 21 and with gate trenches that include a gate electrode 15 and a first field electrode 17. Referring to FIG. 17A a first trench 104 is formed which extends from the first surface 101 into the semiconductor body 100. The first trench 104 can be produced using any conventional method for producing a trench in a semiconductor body.

Figure 17B:
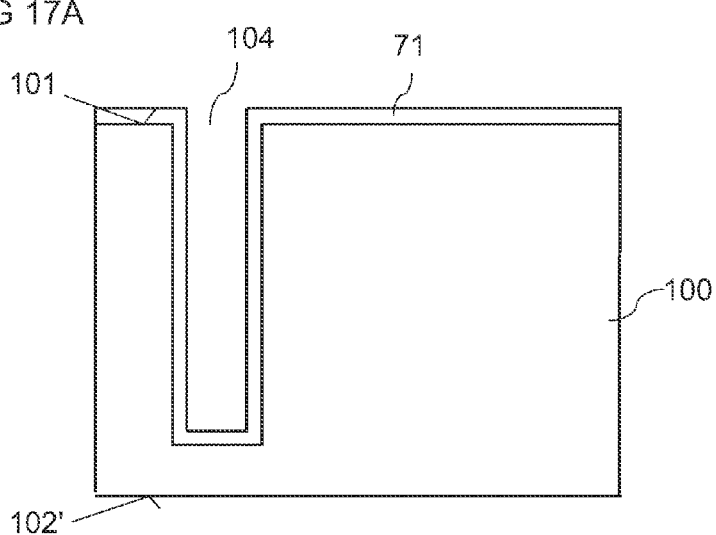

Referring to FIG. 17B a first dielectric layer 71, which is, for example an oxide layer, is produced at least at the sidewalls of the first trench 104. In the embodiment illustrated in FIG. 17B this dielectric layer 71 is conformly formed on the sidewalls and the bottom of the first trench 104 and on the first surface 101. The first dielectric layer 71 includes, for example, at least one of a nitride layer and an oxide layer.

Figure 17C:
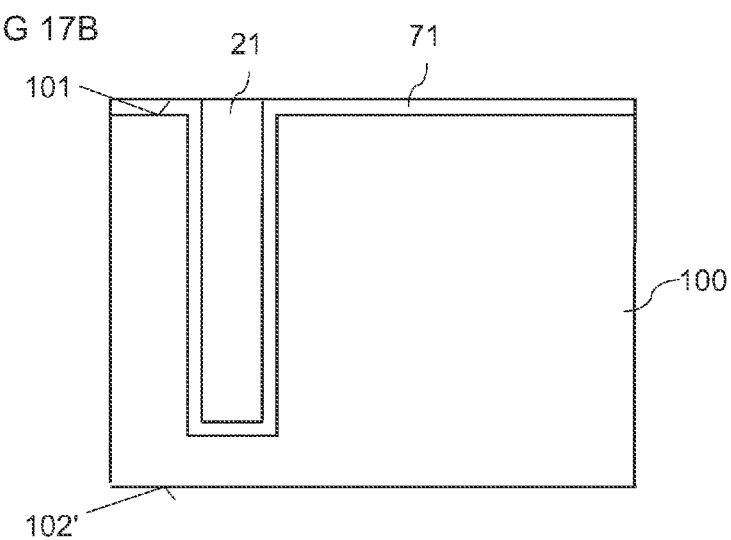
Figure 17D:
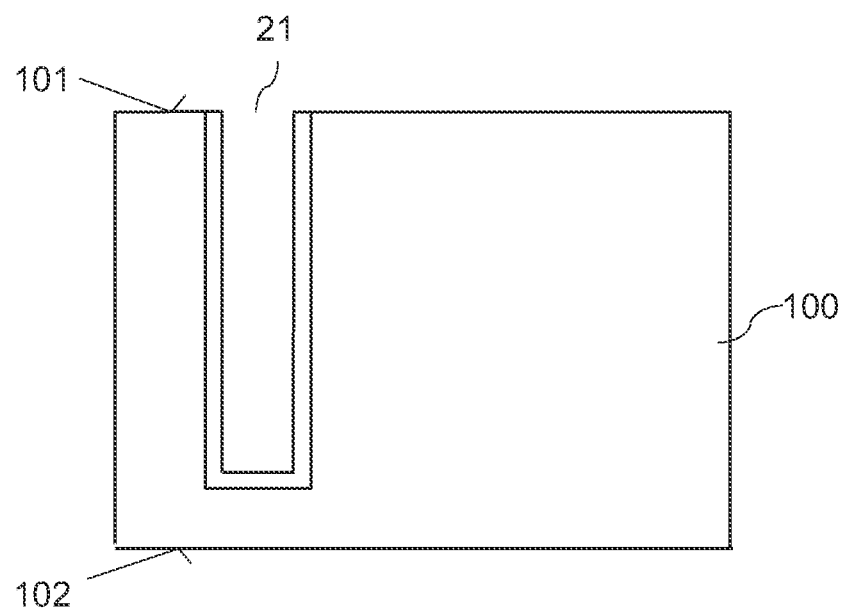

Referring to FIG. 17C the gate connection electrode 21 is formed in the first trench 104. The first gate connection electrode 21 includes, for example, a metal or a doped polycrystalline semiconductor material, like polysilicon. Producing the gate connection electrode 21 includes, for example, depositing an electrode layer that completely fills the trench 104 and removing the electrode material above the first surface 101 by one of a planarizing or an etching method.

Figure 17E:
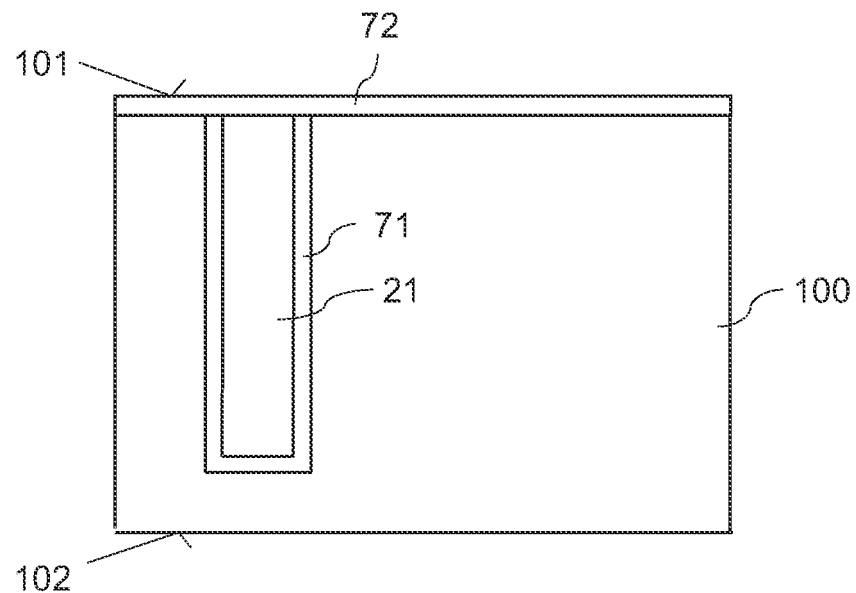

Referring to FIG. 17E an oxide layer 72 is formed on the gate connection electrode 21. This oxide layer is, for example, formed using a thermal oxidation process. The oxide layer 72 on the gate connection electrode 21 can be produced additionally to the dielectric layer 71 on the first surface. However, referring to FIGS. 17D and 17E the dielectric layer 71 on top of the first surface 101 can be removed (see FIG. 17D) and the oxide layer 72 can be produced to cover the gate connection electrode 21 and the first surface 101 (see FIG. 17E). When the oxide layer 72 is produced by a thermal oxidation process, the thickness of the oxide layer on top of the gate connection electrode 21, which includes, for example, a polycrystalline semiconductor material, is usually thicker than the thickness of the oxide layer on top of the first surface 101. However, this is not explicitly shown in the figures.

Figure 17F:
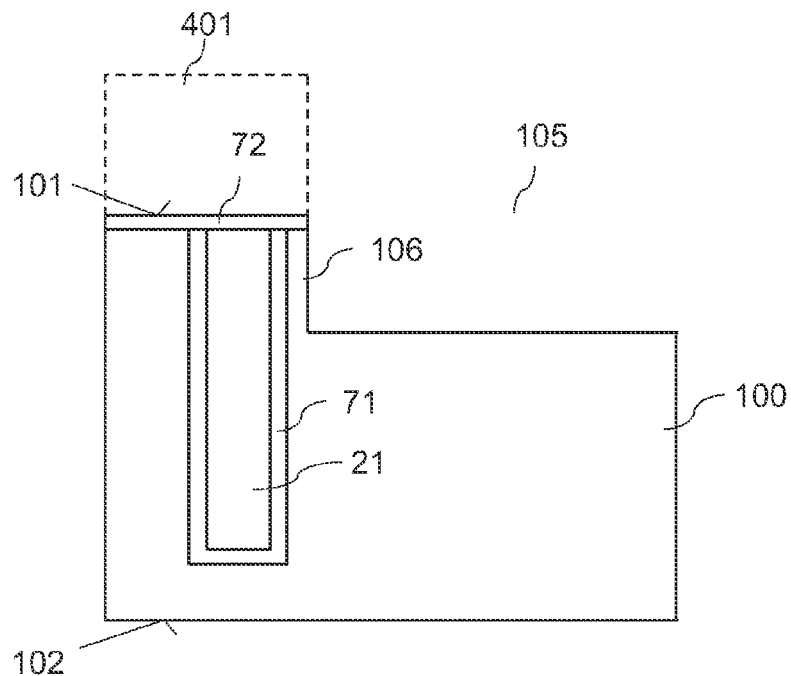

Referring to FIG. 17F at least one second trench 105 is produced to extend from the first 101 into the semiconductor body 100. The at least one second trench 105 can be produced using any conventional method steps for producing a trench in a semiconductor body. This method involves, for example, an etching process supported by an etch mask. In the example illustrated in FIG. 17F the oxide layer 72 acts as an etch mask. For this, the oxide layer 72 is structured using a further etch mask 401 (shown in dashed lines in FIG. 17F). The etch mask 401 for structuring the oxide layer 72 is usually removed before performing the etching process for producing the at least one second trench 105. Of course, any other mask layer than an oxide layer, like oxide layer 71, can be used for producing the at least one second trench as well. The at least one second trench 105 is arranged distant to the first trench in the semiconductor body 100.

Figure 17G:
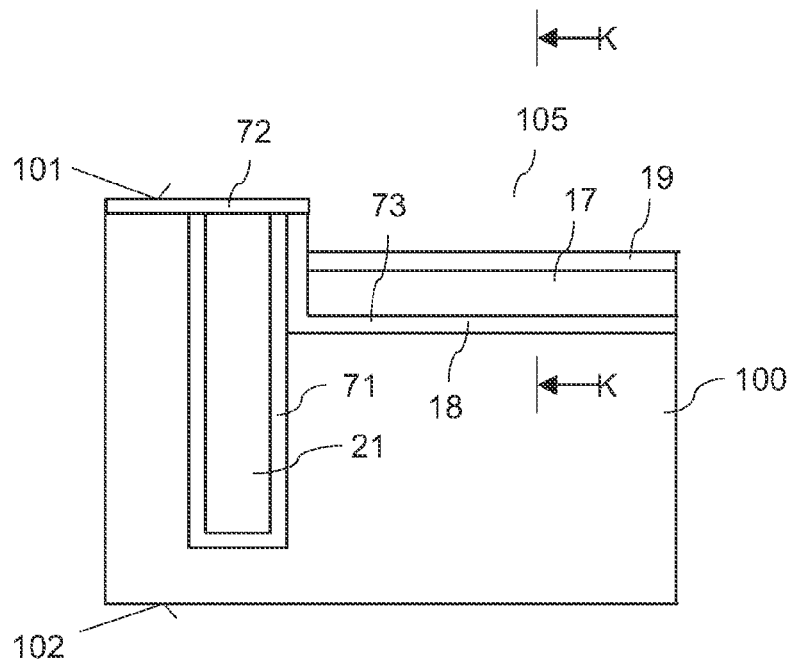

Referring to FIG. 17G a dielectric layer 73 which covers the sidewalls and the bottom of the second trenches 105 is produced. On this dielectric layer 73 the first field electrode and on top of this field electrode a further dielectric layer 19 is produced which in the completed component separates the first field electrode 17 from the gate electrode 15. The dielectric layer 73 covering the bottom and the sidewalls of the second trenches 105 in the completed transistor component forms the dielectric layer 18 that insulates the first field electrode 17 from the semiconductor body 100. The first field electrode 17 is, for example, produced by depositing an electrode layer that completely fills the trench 107 and by etching back the electrode layer down to a desired height level. The dielectric layers 73, 75 are, for example, nitride and/or oxide layers.

According to one embodiment, the dielectric layer 73 is, for example, a thermal oxide layer produced by thermally oxidizing the semiconductor material surrounding the second trenches 15. A mesa region 106 (see FIG. 17F) between the first and second trenches 104, 105 is, in particular, selected such that this mesa region 106 is completely oxidized during this method step.

Figure 17H:
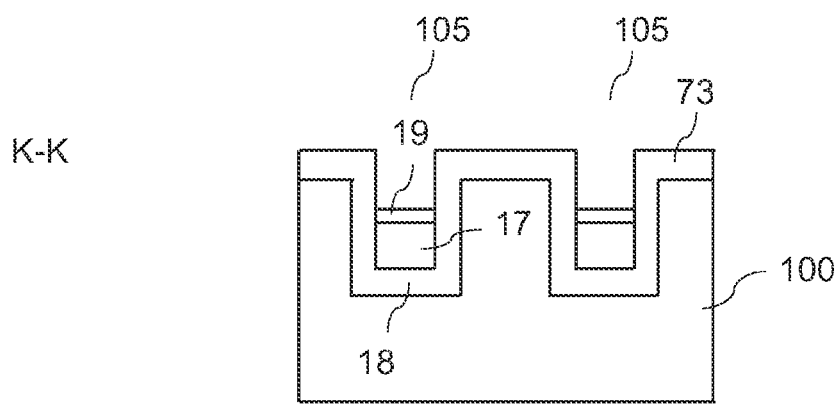

FIG. 17H illustrates a vertical cross section through the semiconductor body 100 in a vertical section plane K-K which extends through the second trenches 105. It can be seen that the first dielectric layer 73 covers the bottom and the sidewalls of the trenches 105, that first field electrode 17 fills a lower portion of the trenches 105 and that the further dielectric layer 19 covers the electrode layer 74.

Figure 17I:
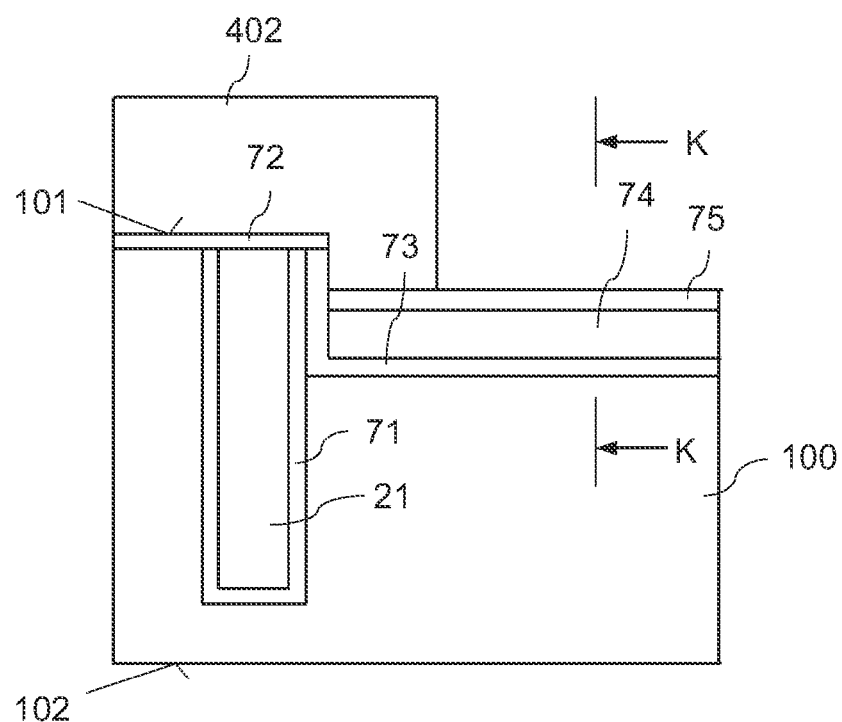
Figure 17J:
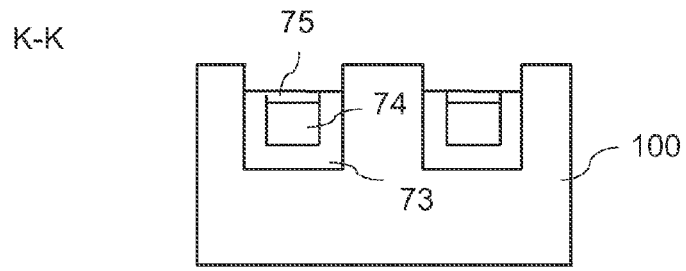

Referring to FIGS. 17I and 17J the dielectric layer 73 in the second trenches 105 is removed or etched back down to the dielectric layer 19 or the first field electrode 17. A vertical cross section through the semiconductor body 100 in the vertical section plane K-K after this removal process is illustrated in FIG. 17J. Optionally, sections of the second trenches 105 that are close to the first trench 104 are protected from removing the dielectric layer 73 in this region. For this, a mask layer 402 which covers the first trench 104 during the etching process can also be produced on these sections of the second trenches 105. Such mask layer 402 is illustrated in FIG. 17I.

Figure 17K:
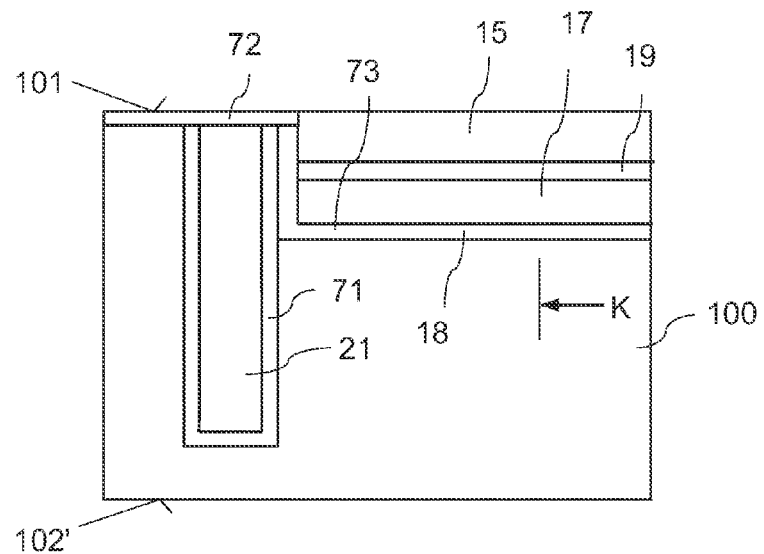

In next method steps a gate dielectric is produced on the sidewalls of the second trenches 105 and the trenches are filled with an electrode material that forms the gate electrode 15. The result of these method steps is illustrated in FIG. 17K, wherein in the cross section illustrated in FIG. 17K only the gate electrode 15 but not the gate dielectric is visible. In this connection it should be mentioned that the dielectric layer which separates the first field electrode 17 from the gate electrode 15 can be produced together with forming the gate dielectric instead of producing this dielectric layer immediately after producing the first field electrode 17.

Figure 17L:
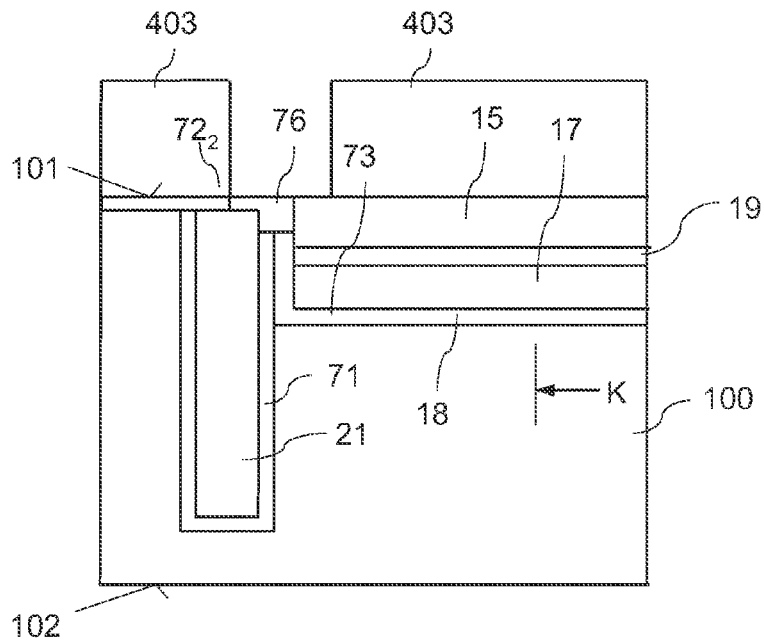

Referring to FIG. 17K the gate electrode 15 is separated from the gate connection electrode 21 by a section of the first dielectric layer 71 arranged in the first trench 104 and by a section of the dielectric layer 73 produced in the second trenches 105. Referring to FIG. 17L these layers 71, 73 are removed by an etching process using an etch mask 403 in regions adjacent to the first surface 101 in order to produce a cavity between the gate electrode 15 and the gate connection electrode 21. This cavity is then filled with an electrode material 76 which forms a connection electrode 15' that electrically connects the gate electrode 15 with the gate connection electrode 21.

The component is completed by further method steps which correspond to the method steps illustrated in FIGS. 6A to 6E for electrically contacting the gate connection electrode 21 and the drain region 14 (not shown in FIG. 17L) at the second surface, and for producing source and body regions and the source electrode in the region of the first surface 101 of the semiconductor body. The first field electrode 17 is electrically connected with the source electrode in a manner not illustrated in detail.

FIG. 18A to 18K illustrate a further embodiment of a method for producing a vertical transistor component with a connection trench that includes a gate connection electrode 21 and with gate trenches that include a gate electrode 15 and a first field electrode 17.

Figure 18A:
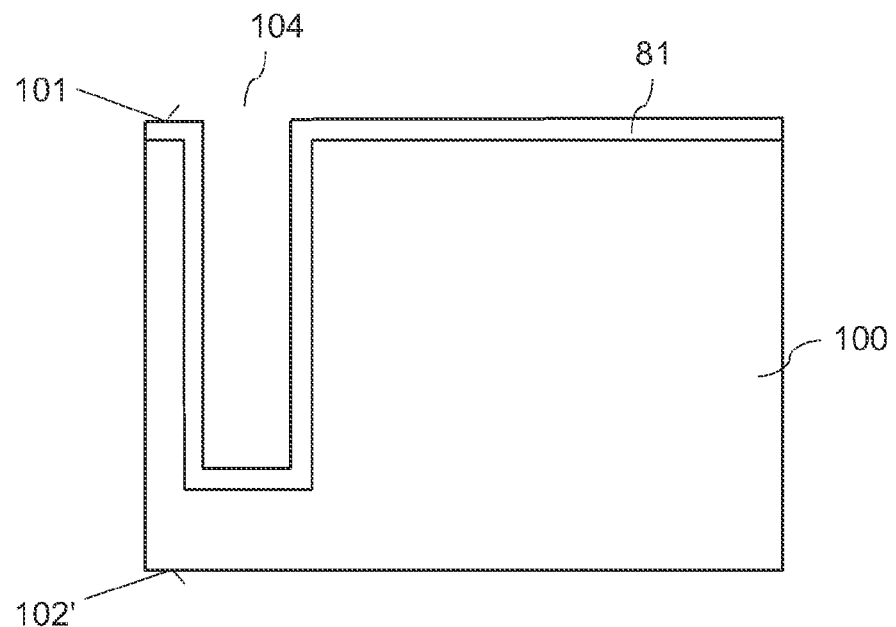
FIGS. 18A to 18L illustrate method steps for producing a vertical transistor component according to a tenth embodiment.

Referring to FIG. 18A a first trench 104 is produced to extend from the first surface 101 into the semiconductor body 100, and a first dielectric layer 81, such as an oxide layer, is produced at least on the sidewalls of the first trench 104.

Figure 18B:
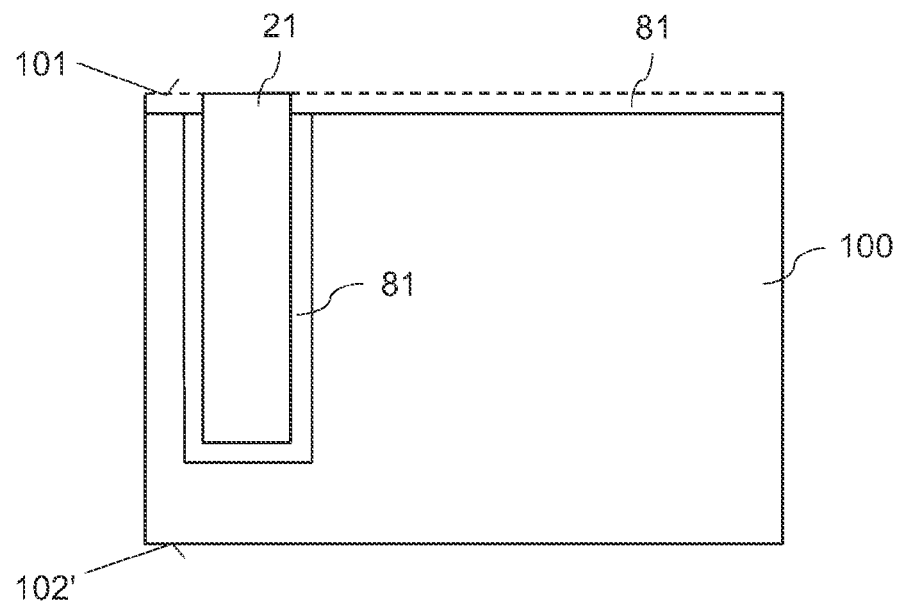

Referring to FIG. 18B the first gate connection electrode 21 is produced in the first trench 104.

Figure 18C:
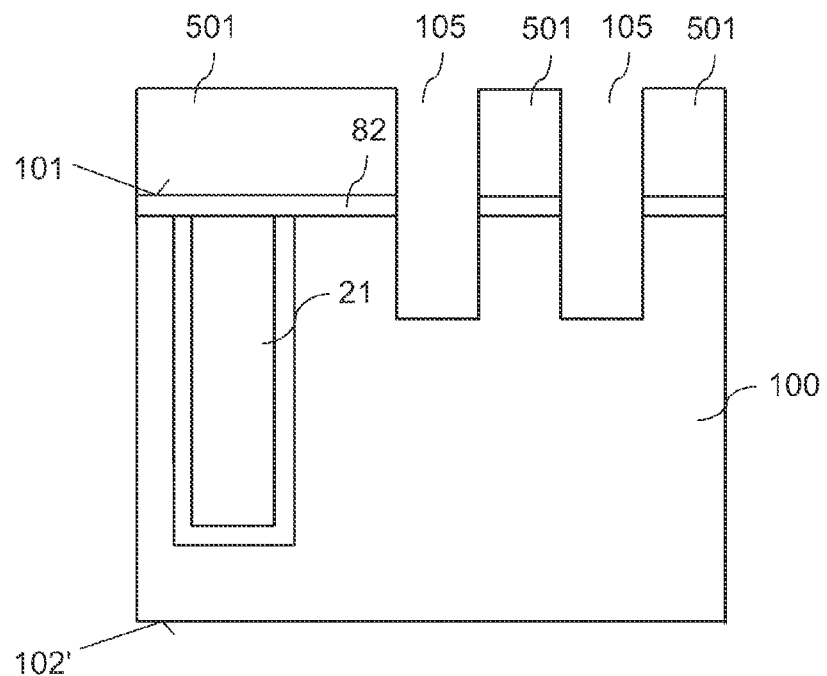

Referring to FIG. 18C second trenches 105 are formed to extend into the semiconductor body 100 from the first surface 101. These trenches 105 are, for example, produced using an etching method supported by an etch mask. The etch mask is, for example an oxide mask 82 which has been structured using a further etch mask, like a resist mask 501 (illustrated in dashed lines in FIG. 18C). The further etch mask 501 is usually removed before producing the at least one second trench 105. The oxide mask 82 for etching the second trenches 105 may include those sections of the first dielectric layer 81 arranged on the first surface, and may additionally include a further oxide layer on the gate connection electrode 21, wherein this further oxide layer can be produced using a thermal oxidation process. Alternatively, the first dielectric layer is removed for the first surface 101 after producing the first trench—which is illustrated in dashed lines in FIG. 18B—and an oxide layer 82 acting as the etch mask for producing the second trenches 105 is produced on the first surface 101 and on the gate connection electrode 21.

The second trenches 105 can be produced to have a strip-like geometry and to extend substantially parallel to the first trench 104. However, the second trenches 105 could also be produced to have a grid-like geometry.

Figure 18D:
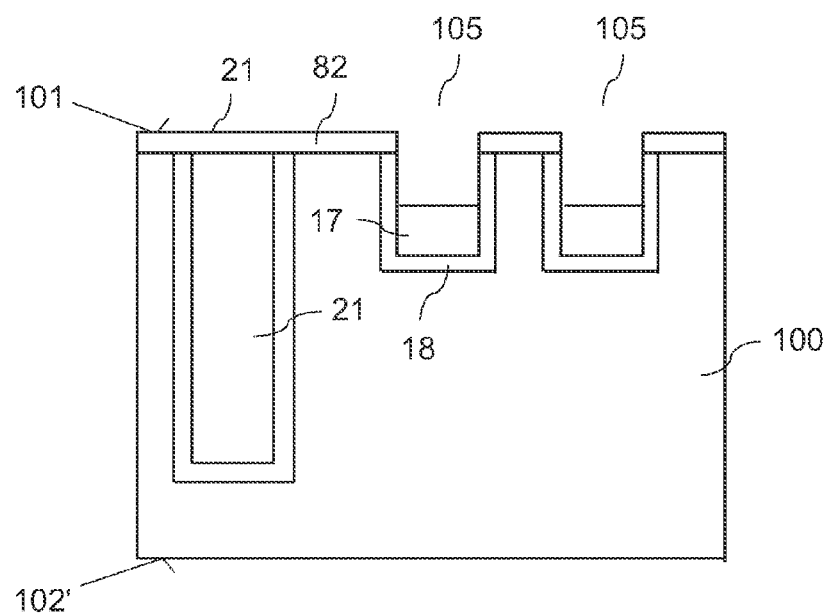

In next method steps illustrated in FIG. 18D a dielectric layer 83 which covers the bottom and the sidewalls of the second trenches 105 and a first field electrode 17 on the dielectric layer 83 in the second trenches 105 is produced. The dielectric layer 83 forms the dielectric layer 18 which insulates the first field electrode 17 from the semiconductor body 100 in the completed component.

Figure 18E:
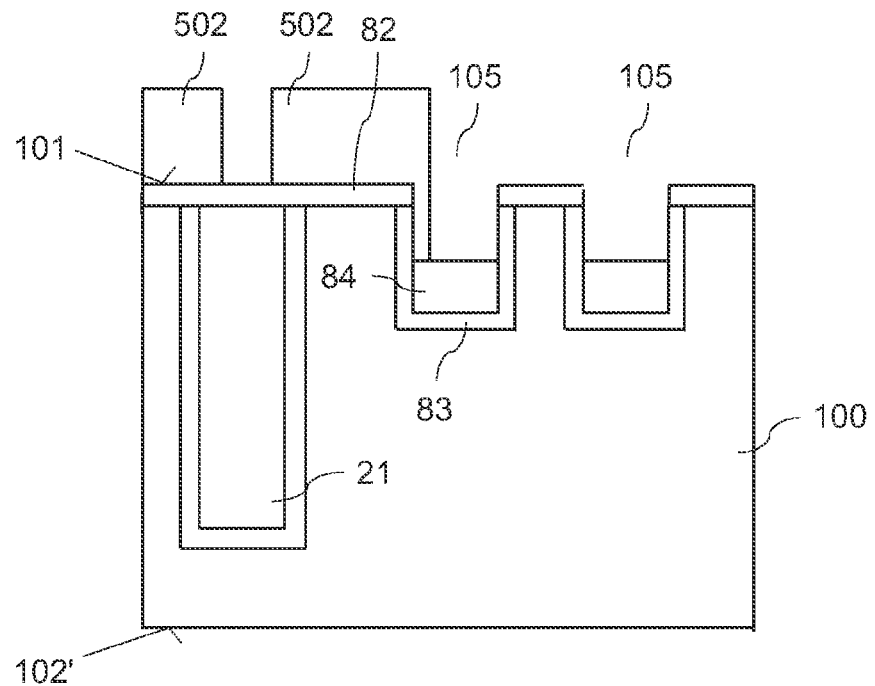

Referring to FIG. 18E the dielectric layer 83 is removed from upper portions of the second trenches 105. This process includes, for example, using an etchant that etches the dielectric layer 83 from the sidewalls of upper portions of the second trenches 105. A mask 502 covers those sections of the first dielectric layer 81 and the optional passivation layers 82 which are not to be removed by the etching process. Further, the mask 502 optionally also covers the sidewall of that second trench 105 that is arranged closest to the first trench 104 in order to keep the dielectric layer 83 along this sidewall.

Figure 18F:
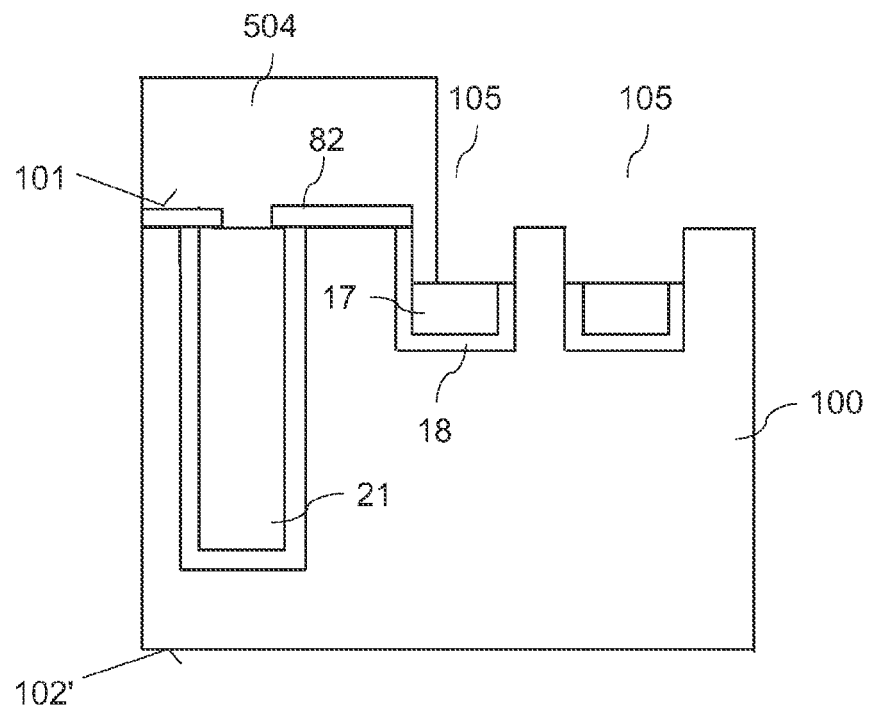

FIG. 18F shows the component after removing the dielectric layer 83 from upper portions of the second trenches 105, wherein this removal process forms the dielectric layer 18 in the lower portions of the second trenches 105. In this process, the dielectric layer 83 is also removed from the first surface 101 between the second trenches 105. The etching process that removes the dielectric layer 83 from these upper portions can also be used to etch through the optional passivation layer 82 down to the gate connection electrodes 21, which is also illustrated in FIGS. 18E to 18F.

Figure 18G:
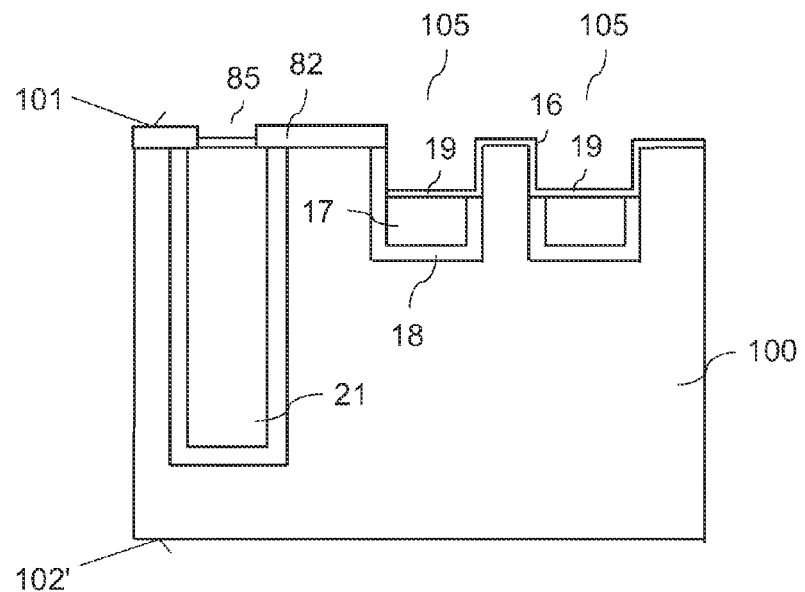
Figure 18H:
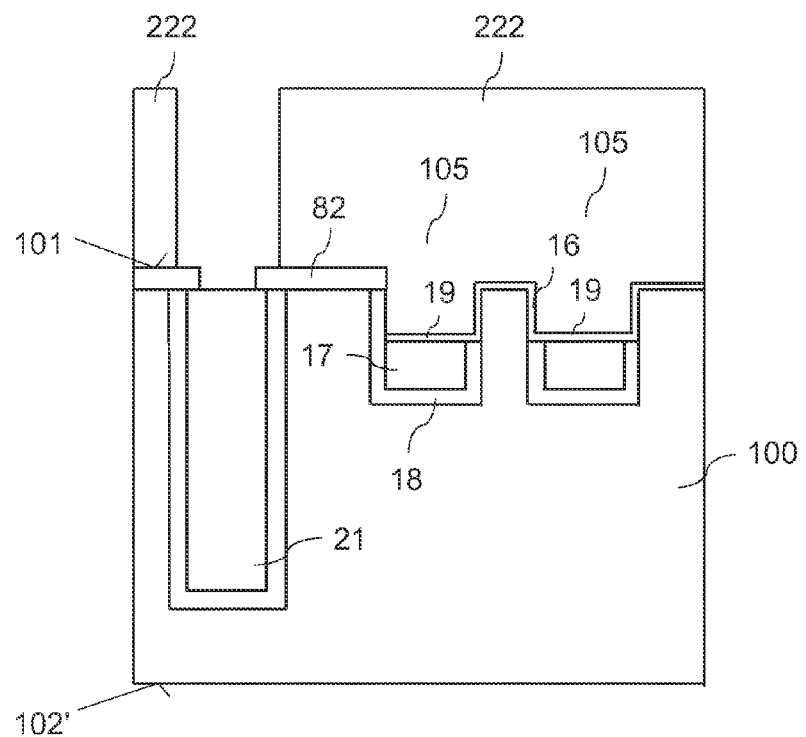

Referring to FIG. 18G the gate dielectric 16 and the dielectric layer 19 which insulates the first field electrode 17 from the gate electrode 15 is produced. Producing these electrode layers 16, 19 includes, for example, a thermal oxidation process. In this process, an oxide layer is also formed on the first surface 101 of the semiconductor body 100. In case a contact whole has opened to the gate contact electrode 21 a dielectric layer 85 is also formed on the gate connection electrode 21. In this case the dielectric layer is removed from the gate connection electrode 21 in a next method step which is illustrated in FIG. 18H. This method step involves an etching process supported by a further etch mask 503 which leaves the dielectric layer 85 on the gate connection electrode 21 uncovered.

Figure 18I:
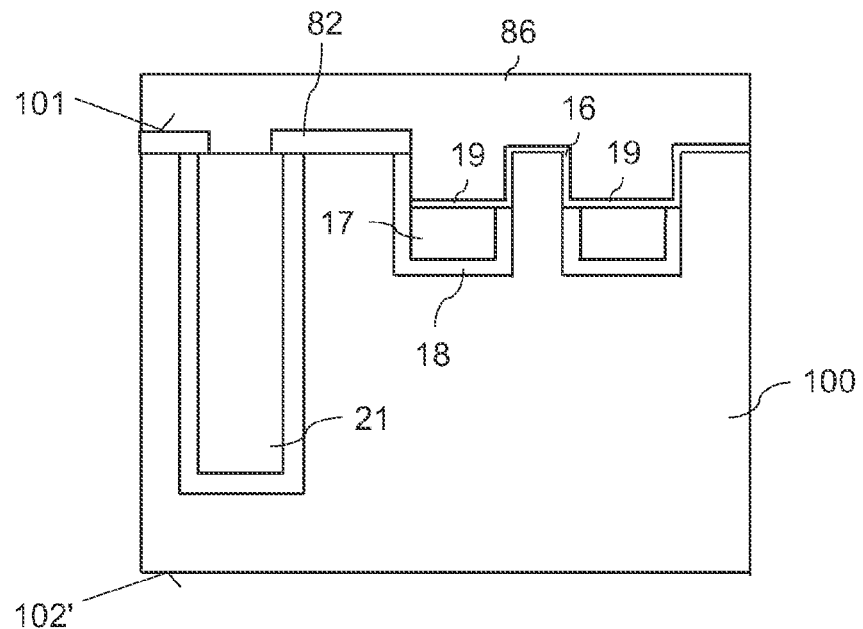

Referring to FIG. 18I an electrode layer is deposited above the gate connection electrode 21 in the first trench and in the second trenches 105.

Figure 18J:
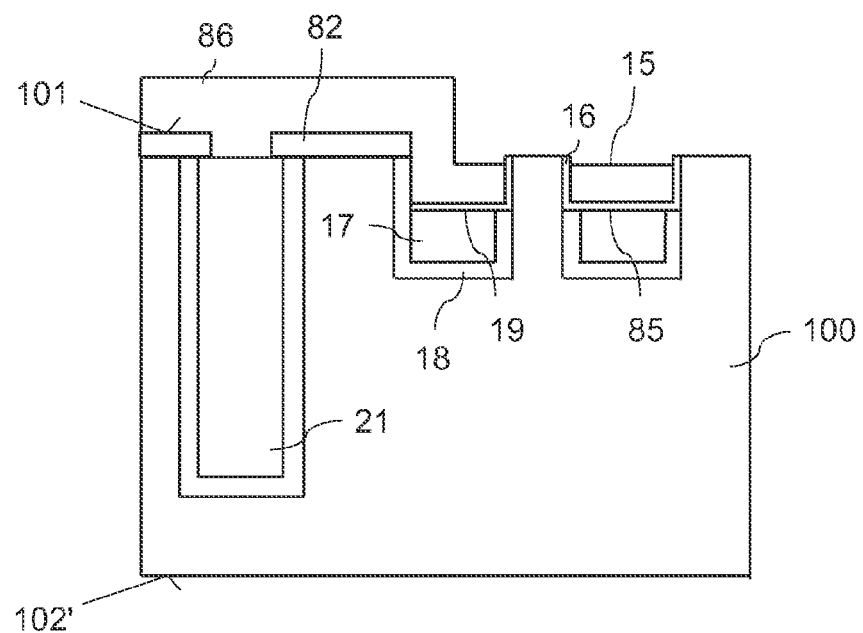

Referring to FIG. 18J this electrode layer 86 is etched back in the second trenches 105 in order to form the gate electrode 15, wherein in the second trench 105, which is arranged closest to the first trench 104 the gate electrode layer 86 is only etched back to such an extent that the gate electrode 15 arranged in this trench is connected to the gate connection electrode 21 by a section of the electrode layer 86 arranged above the first surface 101. This section of the electrode layer 86 forms the further gate connection electrode 15'. The sections of the gate electrode 15 arranged in the individual trenches are either electrically connected with one another by a further gate connection electrode arranged in a trench that extends perpendicular to the gate trenches or, by producing the gate trenches such that they have a grid-like geometry. In this case the individual gate electrode sections arranged in the gate trenches are "automatically" electrically connected with one another. Further, those sections of the dielectric layer 16, 19 that are revealed when etching back the electrode layer 86 are removed, these are those sections of the dielectric layer 82 which are arranged on the first surface 101 between the second trenches 105.

Figure 18K:
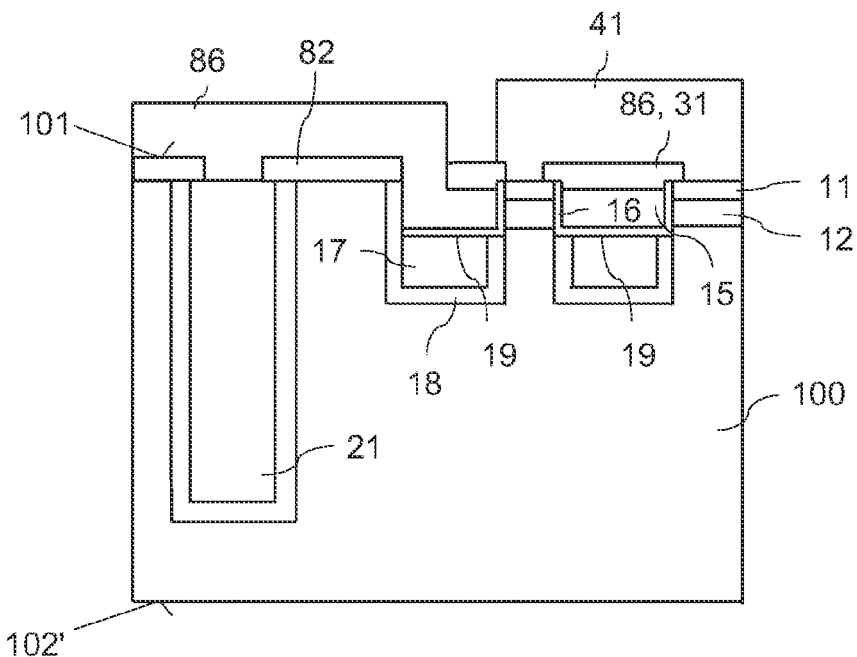
Figure 18L:
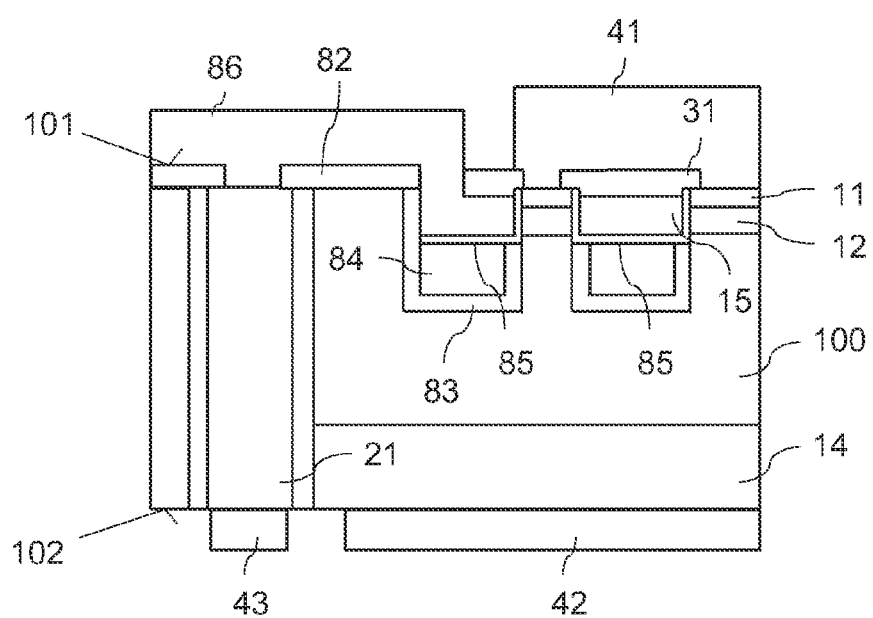

Referring to FIGS. 18K and 18L the component is completed by producing source and body regions 11, 12 in the semiconductor body 100 below the first surface 101, by producing insulation layers 31 above the gate electrode 15 and by producing the source electrode 41 above the first surface 101. Further, the gate connection electrode 21 is uncovered at the second surface 102 by removing a section of the semiconductor body 100 at the second surface, and a gate contact electrode 43 and a drain electrode 42 are produced on the second surface 102.

Figure 19A:
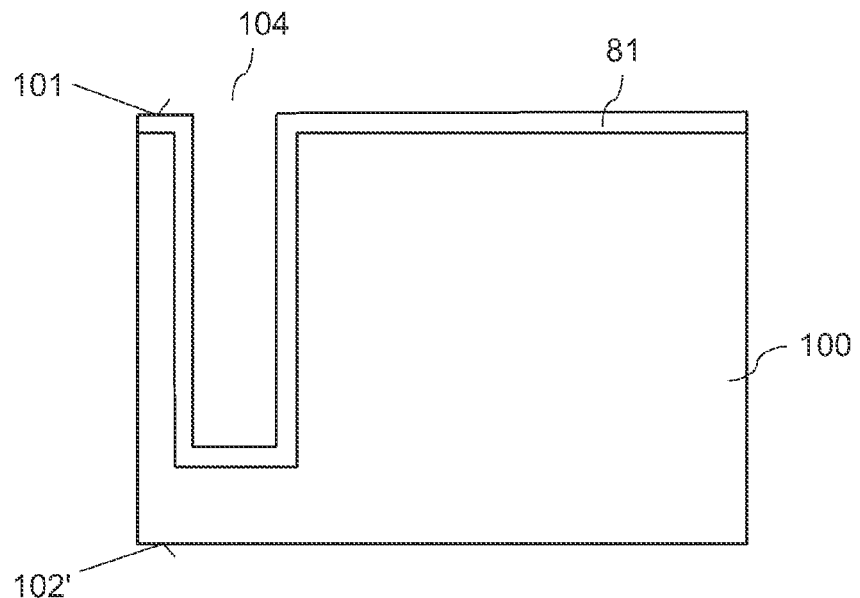
FIGS. 19A to 19K illustrates method steps for producing a vertical transistor component according to an eleventh embodiment.

FIGS. 19A to 19J illustrate a method which is modified compared with the method according to FIG. 18 for producing a vertical transistor component. Referring to FIG. 19A a first trench 104 is produced in the semiconductor body 100, and a first dielectric layer 81 is produced at least along the sidewalls of this first trench 104. In the embodiment illustrated in FIG. 19A, the first dielectric layer 81 is produced along the sidewalls and the bottom of the first trench 104 and on the first surface 101 of the semiconductor body 100. The first dielectric layer 81 is, for example, an oxide layer or a nitride layer.

Figure 19B:
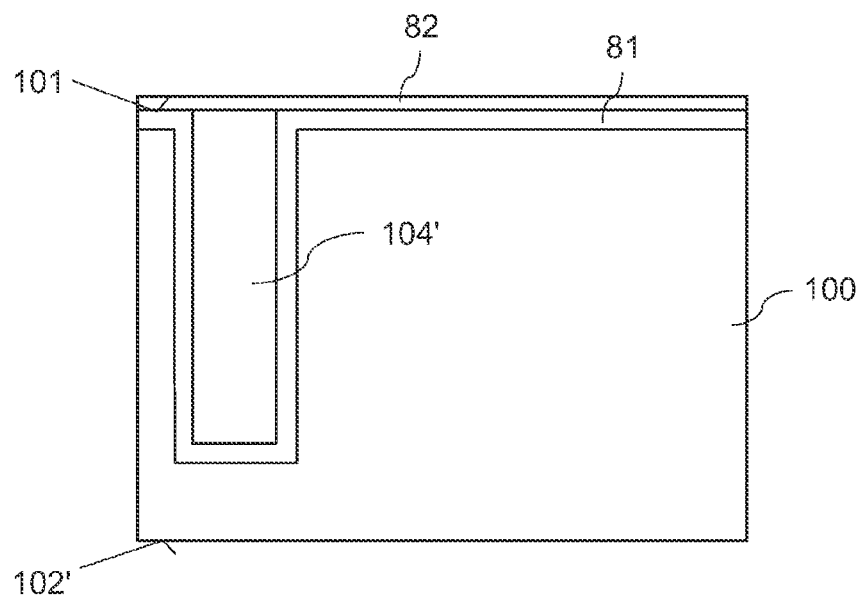

Referring to FIG. 19B a second dielectric layer 82 is produced on the arrangement with the semiconductor body 100 and the first dielectric layer 81. This second dielectric layer 82 is produced above the first surface 101 such that it closes the first trench 104, so that a cavity 104' exists below the second dielectric layer 82. The second dielectric layer 82 is, for example, produced using a non-conformal deposition process.

Figure 19C:
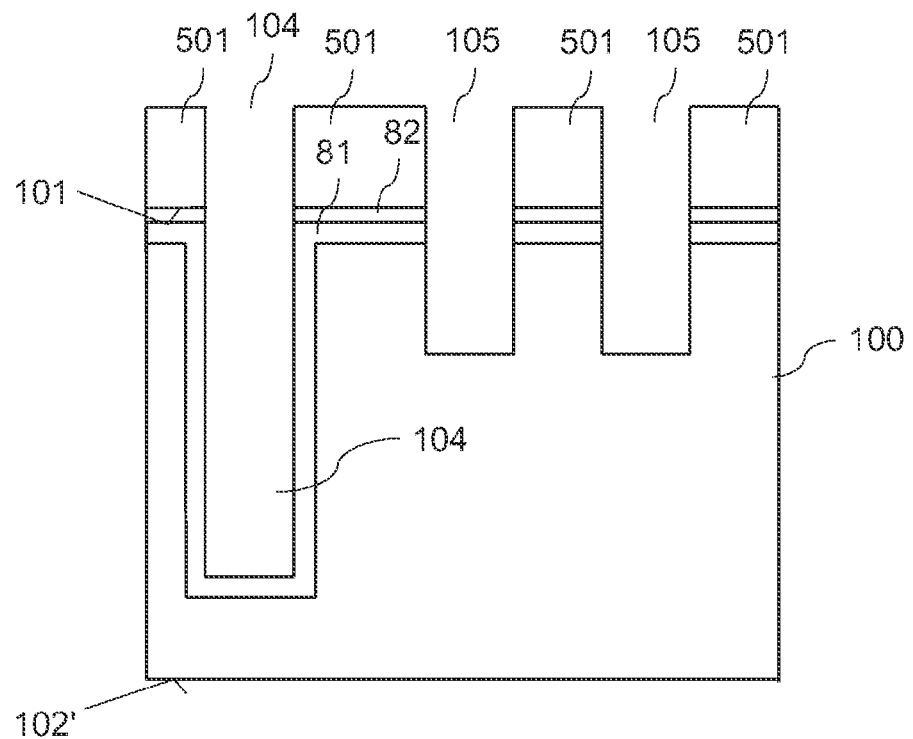

Referring to FIG. 19C the second trenches 105 are produced in next method steps. Producing the second trenches 105 includes, for example, an etching process supported by an etch mask 501. The etch mask 501 has openings at those positions where the second trenches 105 are to be produced. The etch mask 501 has a further opening above the first trench 104, so that during the etching process the first trench 104 is again opened.

Figure 19D:
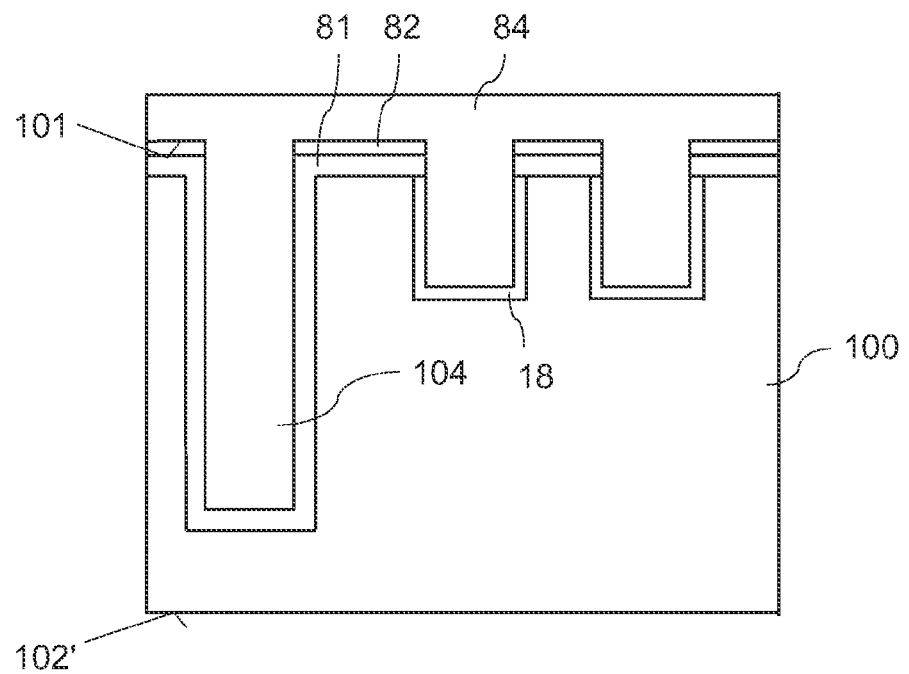
Figure 19E:
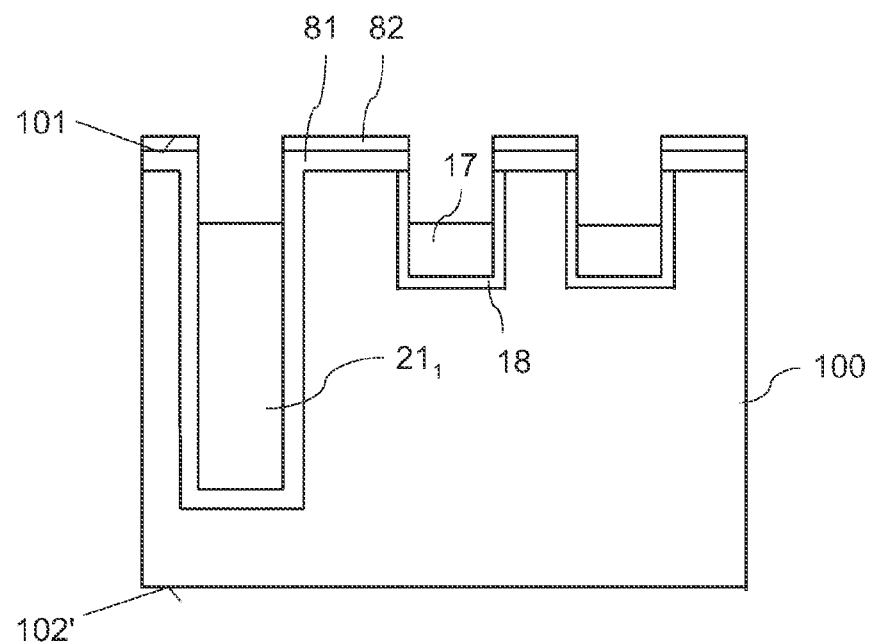

Referring to FIG. 19D, the field electrode dielectric layer 18 is produced along the sidewalls and the bottom of the second trenched 105, and an electrode layer 84 is deposited to fill the first trench 104 and the second trenches 105. Referring to FIG. 19E the electrode layer 84 is etched back to form in the first trench 104 a first section $21_1$ of the gate connection electrode, and to form in the second trenches 105 the first field electrode 17.

Figure 19F:
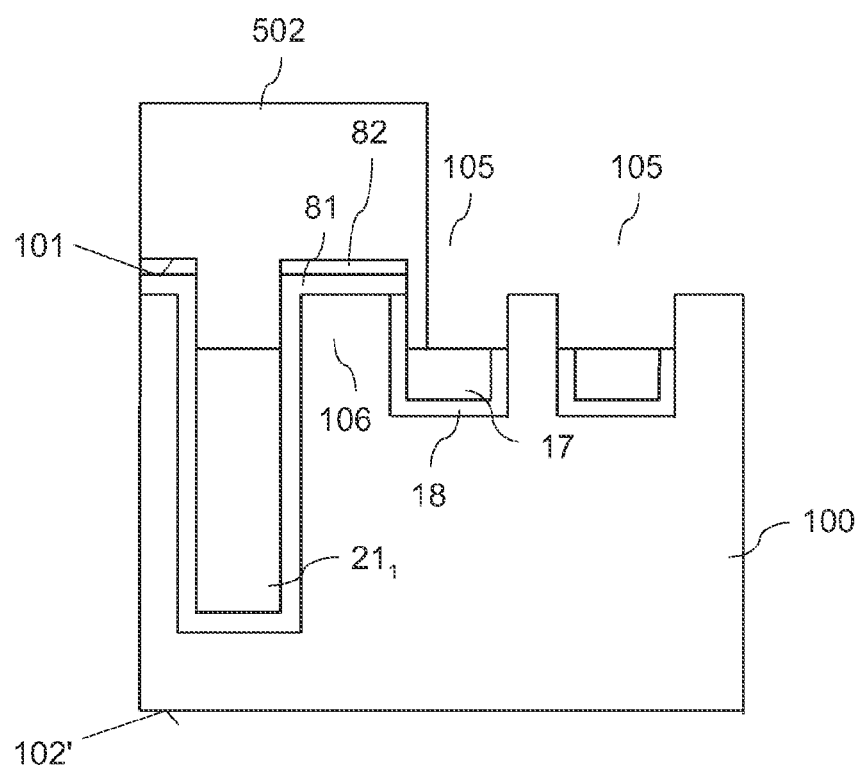

Referring to FIG. 19F the dielectric layer 83 in the second trenches 105 is removed from the upper portion of the second trenches 105 to form the field electrode dielectric layer 18 in the lower section of the second trenches 105. During this process a protection layer 502 protects the dielectric layers in the first trench 104 and in a mesa region 106 between the first trench 104 and that second trench 105 which is arranged closest to the first trench 104. Optionally, the mask layer 502 also protects the sidewalls of the second trench 105 which is adjacent to the mesa region 106. Further, those sections of the dielectric layers 81, 82 which are not covered by the mask layer 502 are removed.

Figure 19G:
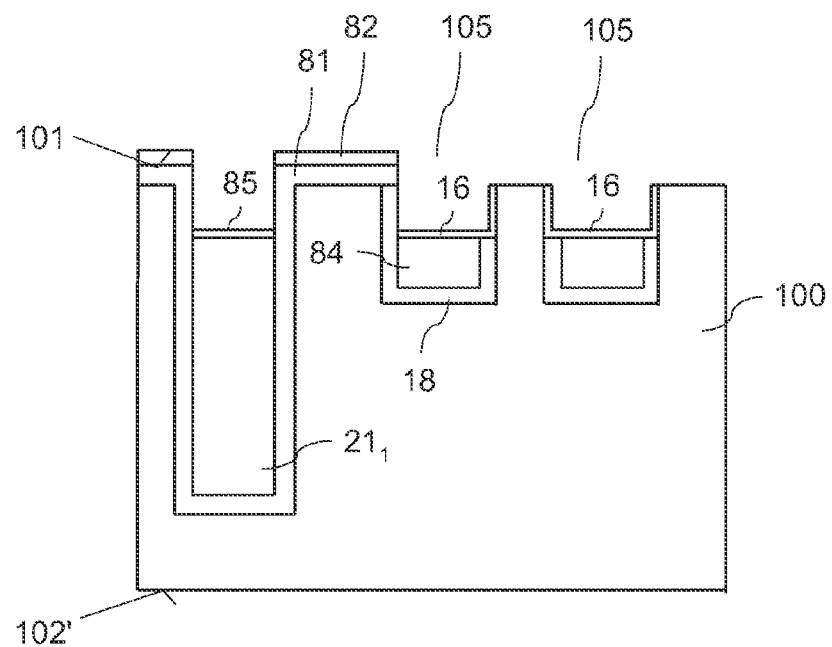
Figure 19H:
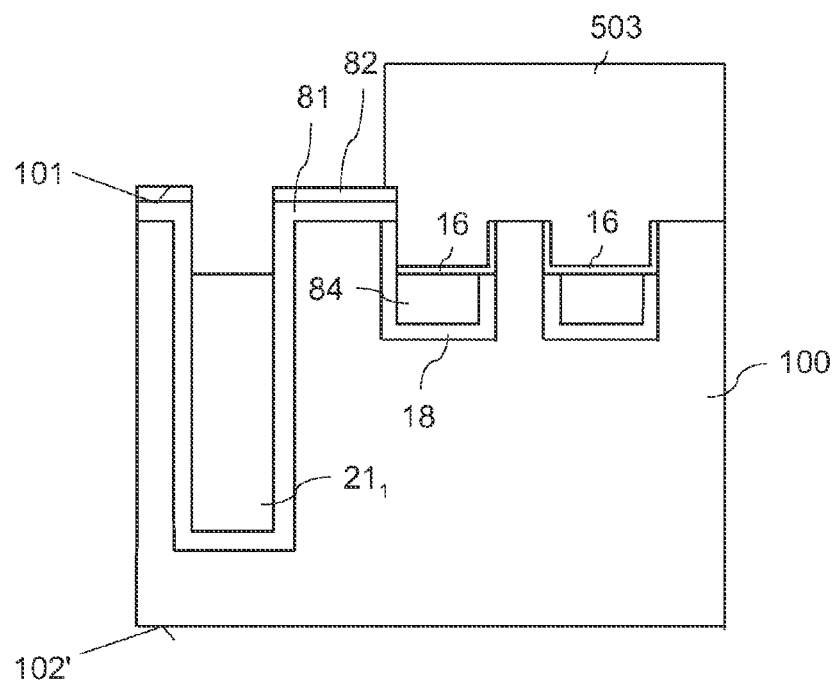

Referring to FIG. 19G the gate dielectric 16 is formed in the second trenches 105. In the embodiment illustrated in FIG. 19G the protection layer 502 above the first trench 104 has been removed when forming the gate dielectric 16, so that a corresponding dielectric layer 85 is also produced on the first section $21_1$ of the gate connection electrode. This dielectric layer 85 is removed from the first section $21_1$ of the gate connection electrode in a next method step illustrated in FIG. 19H. Removing this dielectric layer 85 includes, for example, an etching process during which a mask layer 503 protects the gate dielectric layers 16 in the second trenches from being etched. According to a further embodiment, mask layer 502 shown in FIG. 19F remains on the arrangement after removing the dielectric layer 83 from the upper portion of the second trenches 105 and during the steps of producing the gate dielectric layer 16. In this case, the dielectric layer 85 on the first gate connection electrode section $21_1$ is not produced.

Figure 19I:
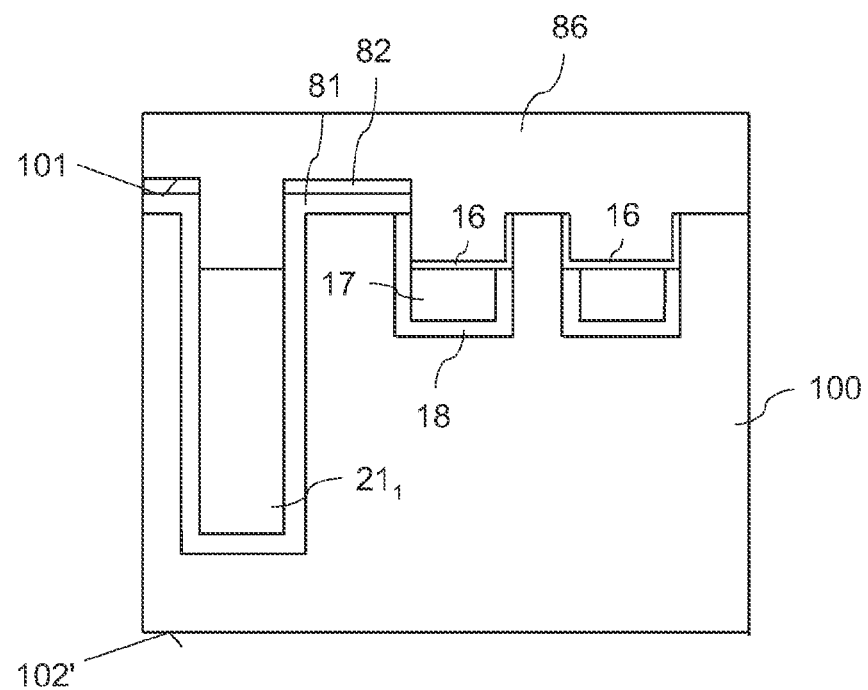

Referring to FIG. 19I a further electrode layer 86 is deposited on the arrangement to completely fill the second trenches 105 in the first trench 104.

Figure 19J:
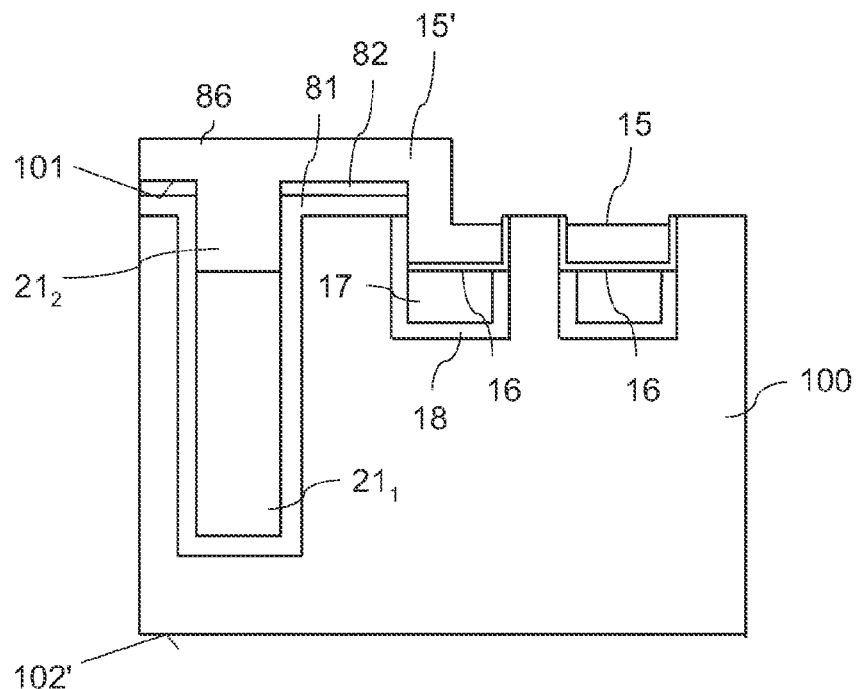

Referring to FIG. 19J, this electrode layer 86 is etched back in the second trenches 105 to form the gate electrode 15. Above the mesa region and above the second trench the electrode layer 86 is not etched back, or is only etched back to such an extent that the electrode layer 86 at least partially remains on the mesa region 106, so as to connect the gate electrodes 15 in the second trenches 105 with the gate connection electrode in the first trench 104. The gate connection electrode in this embodiment includes the first section $21_1$ in the lower portion of the first trench 104 and a second section $21_2$, wherein the second section $21_2$ is formed by those parts of the electrode layer 86 that completely fill the first trench 104.

Figure 19K:
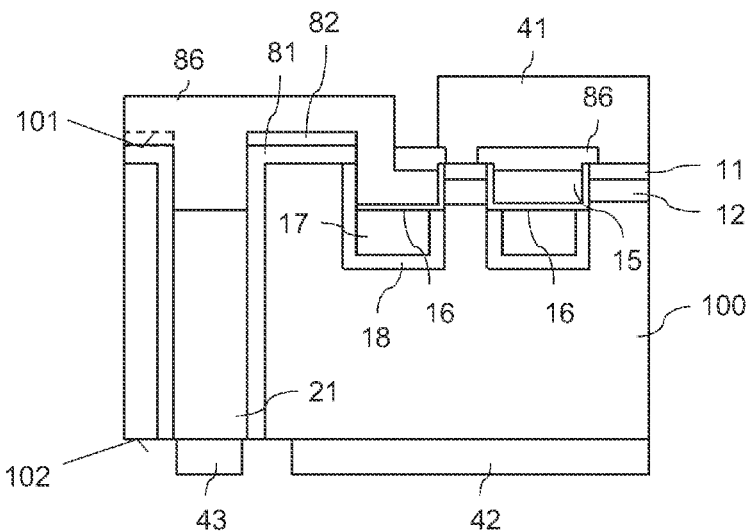

FIG. 19K shows vertical cross section through the completed component. The methods steps required for completing the component correspond to the method steps explained with reference to FIG. 18L, to which reference is made.

Figure 20:
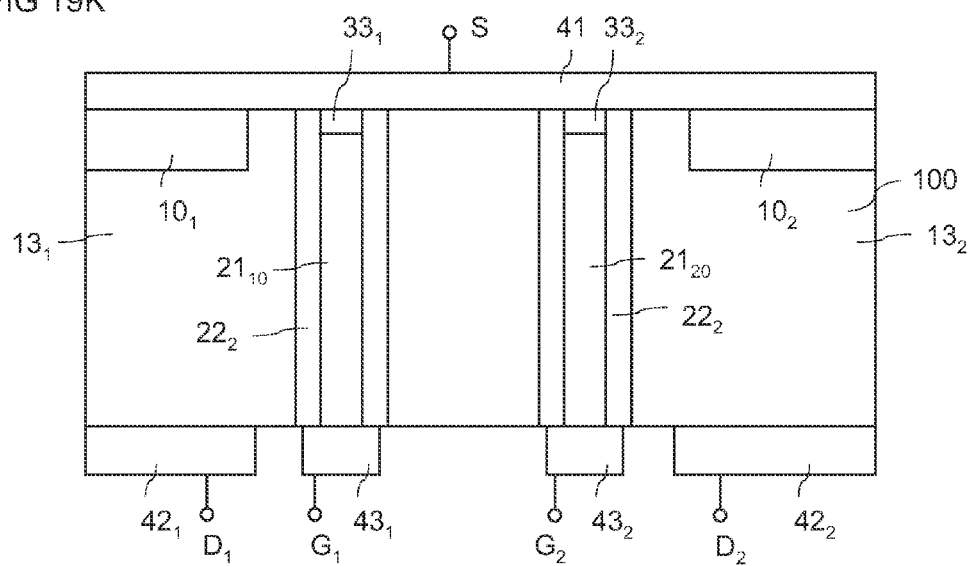
FIG. 20 illustrates a vertical cross section through a vertical transistor component according to a further embodiment.

The technology explained hereinabove of contacting a gate electrode of the vertical transistor component at a second surface of a semiconductor body on which a drain electrode is arranged, allows to produces several vertical transistor components in one common semiconductor body which has a common source electrode and which have different gate and drain electrodes. FIG. 20 illustrates a vertical cross section through a semiconductor body 100 in which two vertical transistor components are integrated. Each of these transistor components has active regions with source and body regions and gate electrodes. In FIG. 20 these active regions are only schematically illustrated and have reference numbers $10_1$, $10_2$. These active regions, in particular the source regions and the body regions within these active regions are commonly electrically connected to a source electrode 41. Each of the transistors has a gate connection electrode $21_{10}$, $21_{20}$ which is arranged in a trench that extends from the first surface 101 to the second surface 102 of the semiconductor body. These gate connection electrodes $21_{10}$, $21_{20}$ are electrically insulated from drift regions $31_1$, $13_2$ and from drain regions $14_1$, $14_2$ of the two transistors. Each of the gate connection electrodes $21_1$, $21_2$ is connected with a gate contact electrode $43_1$, $43_2$ arranged on the second surface 102 in the semiconductor body. The drain regions $14_1$, $14_2$ of the two transistors are each connected with a drain electrode $43_1$, $43_2$.

Figure 21:
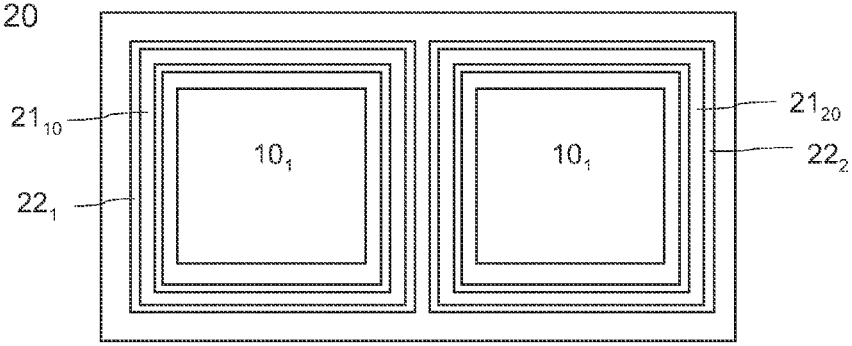
FIG. 21 illustrates a horizontal cross section through the vertical transistor component of FIG. 20.

The gate connection electrodes $21_{10}$, $21_{20}$ and the dielectric layer $22_1$, $22_2$ surrounding these gate connection electrodes $21_{10}$, $21_{20}$ can also be used to electrically insulate the drain and drift regions of the individual transistors from one another. Referring to FIG. 21, the gate connection electrodes, for example, completely surrounds the drift and drain regions of the individual transistors, in order to electrically insulates the transistors from one another.

Features that were explained with reference to one figure can be combined with features of other figures, even in those cases in which this has not explicitly been mentioned.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiment embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical transistor component, comprising:
   a semiconductor body with a first surface and a second surface;
   a drift region;
   at least one source region and at least one body region arranged between the drift region and the first surface, wherein the body region is arranged between the source region and the drift region;
   at least one gate electrode arranged adjacent to the body region, and a gate dielectric arranged between the gate electrode and the at least one body region;
   a drain region arranged between the drift region and the second surface;
   a source electrode electrically contacting the at least one source region, electrically insulated from the gate electrode and arranged on the first surface;
   a drain electrode electrically contacting the drain region and arranged on the second surface;
   at least one gate connection electrode which is electrically insulated from the semiconductor body by a dielectric layer, is arranged in a trench through the semiconductor body, extends to the second surface, and is electrically connected with the at least one gate electrode;
   wherein the at least one source region and the at least one body region are arranged in an active area of the semiconductor body, and wherein the at least one gate connection electrode at least partially surrounds the active area and wherein the dielectric layer completely surrounds the active area through the semiconductor body.

2. The vertical transistor component of claim 1,
   wherein the at least one gate electrode is arranged in a gate trench which extends into the semiconductor body from the first surface, and
   wherein the at least one gate connection electrode is arranged at least partially below the gate electrode and extends from the at least one gate electrode to the second surface.

3. The vertical transistor component of claim 2, wherein the at least one gate connection electrode is arranged only below sections of the at least one gate electrode.

4. The vertical transistor component of claim 1, further comprising:
   at least one first field electrode, arranged in a first trench which extends through the semiconductor body from the first surface to the second surface and connected to the drain electrode.

5. The vertical transistor component of claim 4, further comprising:
   at least one second field electrode, arranged in the first trench, electrically insulated from the first field electrode and electrically connected either to the source electrode or to the gate electrode.

6. The vertical transistor component of claim 5, wherein the gate electrode is arranged in a gate trench arranged distant to the first trench.

7. The vertical transistor component of claim 5, wherein the gate electrode is arranged in the first trench between the second field electrode and the first surface.

8. The vertical transistor component of claim 1, wherein the at least one gate connection electrode is arranged distant to the at least one gate electrode in a lateral direction of the semiconductor body.

9. The vertical transistor component of claim 1, wherein the at least one gate connection electrode completely surrounds the active area.

* * * * *